United States Patent
Yamamoto et al.

(10) Patent No.: US 7,959,988 B2
(45) Date of Patent: *Jun. 14, 2011

(54) COATING FILM FORMING APPARATUS AND METHOD

(75) Inventors: Taro Yamamoto, Koshi (JP); Yasushi Takiguchi, Koshi (JP); Akihiro Fujimoto, Koshi (JP); Hideharu Kyouda, Koshi (JP); Junichi Kitano, Koshi (JP); Osamu Miyahara, Koshi (JP); Kenji Tsutsumi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 812 days.

This patent is subject to a terminal disclaimer.

(21) Appl. No.: 11/944,557

(22) Filed: Nov. 23, 2007

(65) Prior Publication Data
US 2008/0124489 A1    May 29, 2008

(30) Foreign Application Priority Data
Nov. 29, 2006    (JP) ................................. 2006-321009

(51) Int. Cl.
*C23C 14/28*    (2006.01)
(52) U.S. Cl. .................... 427/595; 700/207; 118/712
(58) Field of Classification Search .................. 700/207; 427/595; 118/712
See application file for complete search history.

(56) References Cited

U.S. PATENT DOCUMENTS
| | | | |
|---|---|---|---|
| 2006/0231206 A1 | 10/2006 | Nagasaka et al. | |
| 2007/0052939 A1* | 3/2007 | Ishii et al. | 355/53 |
| 2007/0092807 A1* | 4/2007 | Fukushima et al. | 430/5 |

FOREIGN PATENT DOCUMENTS
| | | |
|---|---|---|
| JP | 9-275090 | 10/1997 |
| JP | 2000-88763 | 3/2000 |
| JP | 2001-195731 | 7/2001 |
| JP | 2003-31542 | 1/2003 |
| JP | 3811376 | 6/2006 |
| WO | 2005/029559 A1 | 3/2005 |

* cited by examiner

*Primary Examiner* — Albert Decady
*Assistant Examiner* — Tejal J Gami
(74) *Attorney, Agent, or Firm* — Oblon, Spivak, McClelland, Maier & Neustadt, L.L.P.

(57) ABSTRACT

A coating film forming apparatus includes a process section including one or more coating units and one or more thermally processing units; a pre-coating cleaning unit configured to perform cleaning on a back surface and an edge portion of a substrate; and a pre-coating check unit configured to check a state of a back surface and an edge portion of the substrate. A control section is configured to realize a sequence of cleaning the substrate by the pre-coating cleaning unit, checking the substrate by the pre-coating check unit, making a judgment based on a check result thus obtained of whether or not a state of particles on a back surface and an edge portion of the substrate is within an acceptable range, and permitting transfer of the substrate into the process section where the state of particles is within the acceptable range.

12 Claims, 11 Drawing Sheets

COATING FILM FORMING APPARATUS AND METHOD

BACKGROUND OF THE INVENTION

1. Field of the Invention

The present invention relates to a coating film forming apparatus and coating film forming method for forming a coating film, such as a resist film, on a substrate before a light exposure process. Particularly, the present invention relates to a coating film forming apparatus and coating film forming method suitable for a double patterning technique.

2. Description of the Related Art

In the process of manufacturing semiconductor devices, photolithography techniques are used for forming circuit patterns on semiconductor wafers (which will be simply referred to as "wafer", hereinafter), which are treated as target substrates. Where a circuit pattern is formed by use of photolithography, the process steps are performed, as follows. Specifically, a resist liquid is first applied to a wafer to form a resist film. Then, the resist film is irradiated with light to perform light exposure on the resist film in accordance with the circuit pattern. Then, the resist film is subjected to a developing process.

In recent years, the integration degree of semiconductor devices becomes increasingly higher to improve the operation speed and so forth. Accordingly, photolithography techniques are required to increase the miniaturization level of circuit patterns formed on wafers. As a photolithography technique for realizing a high resolution of a 45-nm node level, there has been proposed the following immersion light exposure (for example, see U.S. Patent Application Publication No. US 2006/0231206 A1). In this immersion light exposure, a light exposure liquid, such as purified water, having a refractive index higher than air is supplied between the wafer and light exposure projection lens. The wavelength of light radiated from the projection lens is shortened by means of the refractive index of the light exposure liquid, so that the line width obtained by the light exposure is decreased. Further, there has been proposed a double patterning technique for forming micro-patterns by performing patterning operations twice. Combinations of an immersion light exposure technique with a double patterning technique have been studied.

In the double patterning technique, light exposure needs to be performed twice before etching, so particles generated before the light exposure can be easily carried into the light exposure apparatus. If particles are present on the back surface of a wafer, defocusing may occur on portions with the particles during the light exposure process. Conventionally, defocusing is caused only by relatively large particles. However, along with an increase in miniaturization level of technical nodes, defocusing can be caused by smaller particles. Thus, the presence of particles on the back surface of a wafer is becoming a non-negligible problem. Further, along with an increase in miniaturization level, the number of steps in photolithography has become larger and thereby increased the risk of particles being deposited on the back surface of a wafer. Accordingly, it is now more important than ever to prevent particles from being carried into a light exposure apparatus from a coating film forming apparatus for a resist film or the like.

BRIEF SUMMARY OF THE INVENTION

An object of the present invention is to provide a coating film forming apparatus and coating film forming method, which can prevent particles from being carried into a light exposure apparatus as far as possible.

Another object of the present invention is to provide a computer readable storage medium that stores a control program for executing the coating film forming method.

According to a first aspect of the present invention, there is provided a coating film forming apparatus for forming a coating film comprising a resist film or a resist film and an additional film on a substrate, in association with light exposure of the resist film, the coating film forming apparatus comprising: a process section including one or more coating units configured to apply the resist film or the resist film and the additional film onto the substrate, and one or more thermally processing units configured to perform a thermal process necessary for forming the coating film on the substrate; a pre-coating cleaning unit configured to perform cleaning on at least a back surface and an edge portion of the substrate before transferring the substrate into the process section; a pre-coating check unit configured to check a state of a back surface and an edge portion of the substrate before transferring the substrate into the process section; and a control section configured to realize a sequence of cleaning the substrate by the pre-coating cleaning unit, checking the substrate by the pre-coating check unit, making a judgment based on a check result thus obtained of whether or not a first state of particles on a back surface and an edge portion of the substrate is within a first acceptable range, and permitting transfer of the substrate into the process section where the first state of particles is within the first acceptable range.

In the first aspect, the apparatus may further comprise: an interface section disposed between the process section and a light exposure apparatus; a pre-light exposure cleaning unit configured to perform cleaning on at least a back surface and an edge portion of the substrate in the interface section before transferring the substrate into the light exposure apparatus; and a pre-light exposure check unit configured to check a state of a back surface and an edge portion of the substrate before transferring the substrate into the light exposure apparatus, wherein the control section is configured to realize a sequence of cleaning the substrate by the pre-light exposure cleaning unit, checking the substrate by the pre-light exposure check unit, making a judgment based on a check result thus obtained of whether or not a second state of particles on a back surface and an edge portion of the substrate is within a second acceptable range, and permitting transfer of the substrate into the light exposure apparatus where the second state of particles is within the second acceptable range.

In the first aspect, the apparatus may further comprise: a development unit configured to perform a developing process on the substrate after the light exposure, and a thermally processing unit configured to perform a thermal process required before and after the developing process, both of which are disposed in the process section; a post-development cleaning unit configured to perform cleaning on at least a back surface and an edge portion of the substrate transferred from the process section after the developing process; and a post-development check unit configured to check a state of a back surface and an edge portion of the substrate after the developing process, wherein the control section is configured to realize a sequence of cleaning the substrate by the post-development cleaning unit, checking the substrate by the post-development check unit, making a judgment based on a check result thus obtained of whether or not a third state of particles on a back surface and an edge portion of the substrate is within a third acceptable range, and permitting progress of the substrate to a subsequent step where the third state of particles is within the third acceptable range.

According to a second aspect of the present invention, there is provided a coating film forming apparatus for forming a coating film comprising a resist film or a resist film and an additional film on a substrate, in association with light exposure of the resist film, the coating film forming apparatus comprising: a process section including one or more coating units configured to apply the resist film or the resist film and the additional film onto the substrate, and one or more thermally processing units configured to perform a thermal process necessary for forming the coating film on the substrate; a pre-coating cleaning unit configured to perform cleaning on at least a back surface and an edge portion of the substrate before transferring the substrate into the process section; a pre-coating check unit configured to check a state of a back surface and an edge portion of the substrate before transferring the substrate into the process section; and a control section configured to realize a sequence of checking the substrate by the pre-coating check unit, making a judgment based on a check result thus obtained of whether or not a first state of particles on a back surface and an edge portion of the substrate is within a first acceptable range, and permitting transfer of the substrate into the process section where the first state of particles is within the first acceptable range, or cleaning the substrate by the pre-coating cleaning unit and then permitting transfer of the substrate into the process section where the first state of particles is out of the first acceptable range.

In the second aspect, the apparatus may further comprise: an interface section disposed between the process section and a light exposure apparatus; a pre-light exposure cleaning unit configured to perform cleaning on at least a back surface and an edge portion of the substrate in the interface section before transferring the substrate into the light exposure apparatus; and a pre-light exposure check unit configured to check a state of a back surface and an edge portion of the substrate before transferring the substrate into the light exposure apparatus, wherein the control section is configured to realize a sequence of checking the substrate by the pre-light exposure check unit, making a judgment based on a check result thus obtained of whether or not a second state of particles on a back surface and an edge portion of the substrate is within a second acceptable range, and permitting transfer of the substrate into the light exposure apparatus where the second state of particles is within the second acceptable range, or cleaning the substrate by the pre-light exposure cleaning unit and then permitting transfer of the substrate into the light exposure apparatus where the second state of particles is out of the second acceptable range.

In the second aspect, the apparatus may further comprise: a development unit configured to perform a developing process on the substrate after the light exposure, and a thermally processing unit configured to perform a thermal process required before and after the developing process, both of which are disposed in the process section; a post-development cleaning unit configured to perform cleaning on at least a back surface and an edge portion of the substrate transferred from the process section after the developing process; and a post-development check unit configured to check a state of a back surface and an edge portion of the substrate after the developing process, wherein the control section is configured to realize a sequence of checking the substrate by the post-development check unit, making a judgment based on a check result thus obtained of whether or not a third state of particles on a back surface and an edge portion of the substrate is within a third acceptable range, and permitting progress of the substrate to a subsequent step where the third state of particles is within the third acceptable range, or cleaning the substrate by the post-development cleaning unit and then permitting progress of the substrate to a subsequent step where the third state of particles is out of the third acceptable range.

In the first and second aspects, the light exposure apparatus may be an immersion light exposure apparatus configured to perform a light exposure process through a liquid. The pre-coating cleaning unit may include a cleaning liquid supply mechanism configured to supply a cleaning liquid onto the substrate, and a brush for cleaning a back surface and an edge portion of the substrate.

According to a third aspect of the present invention, there is provided a coating film forming method for forming a coating film comprising a resist film or a resist film and an additional film on a substrate in a process section, in association with light exposure of the resist film in a light exposure apparatus, the coating film forming method comprising: performing cleaning on at least a back surface and an edge portion of the substrate before transferring the substrate into the process section; checking a state of a back surface and an edge portion of the substrate before transferring the substrate into the process section after the cleaning; making a judgment based on a check result thus obtained of whether or not a first state of particles on a back surface and an edge portion of the substrate is within a first acceptable range; transferring the substrate into the process section where the first state of particles is within the first acceptable range; applying the resist film or the resist film and the additional film onto the substrate in the process section; and performing a thermal process necessary for forming the coating film on the substrate in the process section.

In the third aspect, the method may further comprise: performing pre-light exposure cleaning on at least a back surface and an edge portion of the substrate before transferring the substrate into the light exposure apparatus; checking a state of a back surface and an edge portion of the substrate after the pre-light exposure cleaning and before transferring the substrate into the light exposure apparatus; making a judgment based on a check result thus obtained of whether or not a second state of particles on a back surface and an edge portion of the substrate is within a second acceptable range; and transferring the substrate into the light exposure apparatus where the second state of particles is within the second acceptable range.

In the third aspect, the method may further comprise: performing a developing process on the substrate after the light exposure; performing a thermal process required before and after the developing process; performing post-development cleaning on at least a back surface and an edge portion of the substrate after the developing process; checking a state of a back surface and an edge portion of the substrate after the post-development cleaning; making a judgment based on a check result thus obtained of whether or not a third state of particles on a back surface and an edge portion of the substrate is within a third acceptable range; and sending the substrate to a subsequent step where the third state of particles is within the third acceptable range.

According to a forth aspect of the present invention, there is provided a coating film forming method for forming a coating film comprising a resist film or a resist film and an additional film on a substrate in a process section, in association with light exposure of the resist film in a light exposure apparatus, the coating film forming method comprising: checking a state of a back surface and an edge portion of the substrate before transferring the substrate into the process section; making a judgment based on a check result thus obtained of whether or not a first state of particles on a back surface and an edge portion of the substrate is within a first acceptable range; transferring the substrate into the process section where the first state of particles is within the first acceptable range, or cleaning the substrate and then transferring the substrate into the process section where the first state of particles is out of the first acceptable range; applying the resist film or the resist film and the additional film onto the substrate in the process section; and performing a thermal process necessary for forming the coating film on the substrate in the process section.

In the fourth aspect, the method may further comprise: checking a state of a back surface and an edge portion of the substrate before transferring the substrate into the light exposure apparatus; making a judgment based on a check result thus obtained of whether or not a second state of particles on a back surface and an edge portion of the substrate is within a second acceptable range; and transferring the substrate into the light exposure apparatus where the second state of particles is within the second acceptable range, or cleaning the substrate and then transferring the substrate into the light exposure apparatus where the second state of particles is out of the second acceptable range.

In the fourth aspect, the method may further comprise: performing a developing process on the substrate after the light exposure; performing a thermal process required before and after the developing process; checking a state of a back surface and an edge portion of the substrate after the developing process; making a judgment based on a check result thus obtained of whether or not a third state of particles on a back surface and an edge portion of the substrate is within a third acceptable range; and sending the substrate to a subsequent step where the third state of particles is within the third acceptable range, or cleaning the substrate and then sending the substrate to a subsequent step where the third state of particles is out of the third acceptable range.

In the third and fourth aspects, the light exposure apparatus may be an immersion light exposure apparatus configured to perform a light exposure process through a liquid.

According to a fifth aspect of the present invention, there is provided a computer readable storage medium that stores a control program for execution on a computer to control a coating film forming apparatus, wherein the control program, when executed, causes the computer to control the coating film forming apparatus to perform the method according to the third or fourth aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will now be described with reference to the accompanying drawings.

Figure 1:
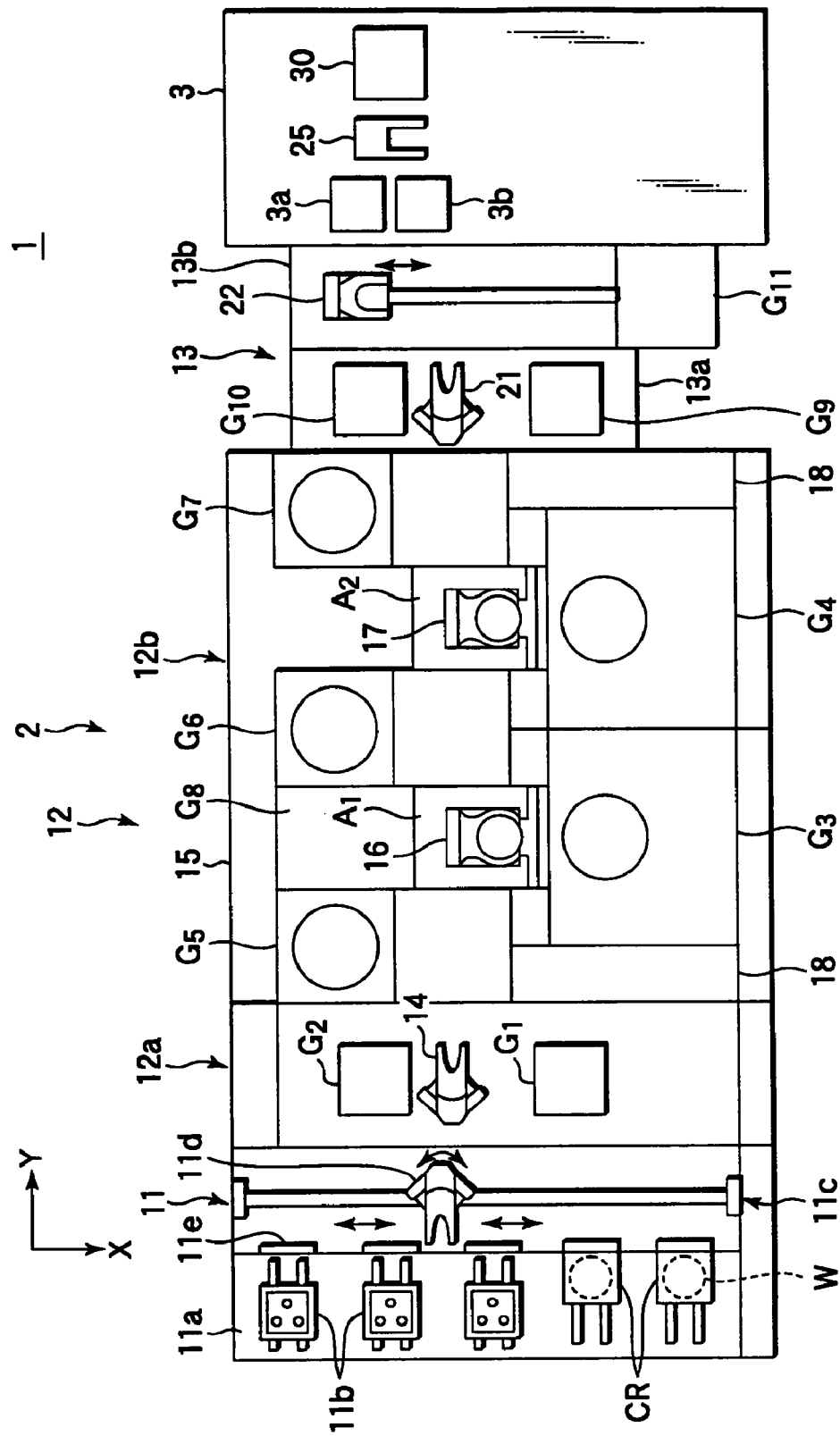
FIG. 1 is a plan view schematically showing a pattern forming system including a coating/developing apparatus according to an embodiment of the present invention.
Figure 2:
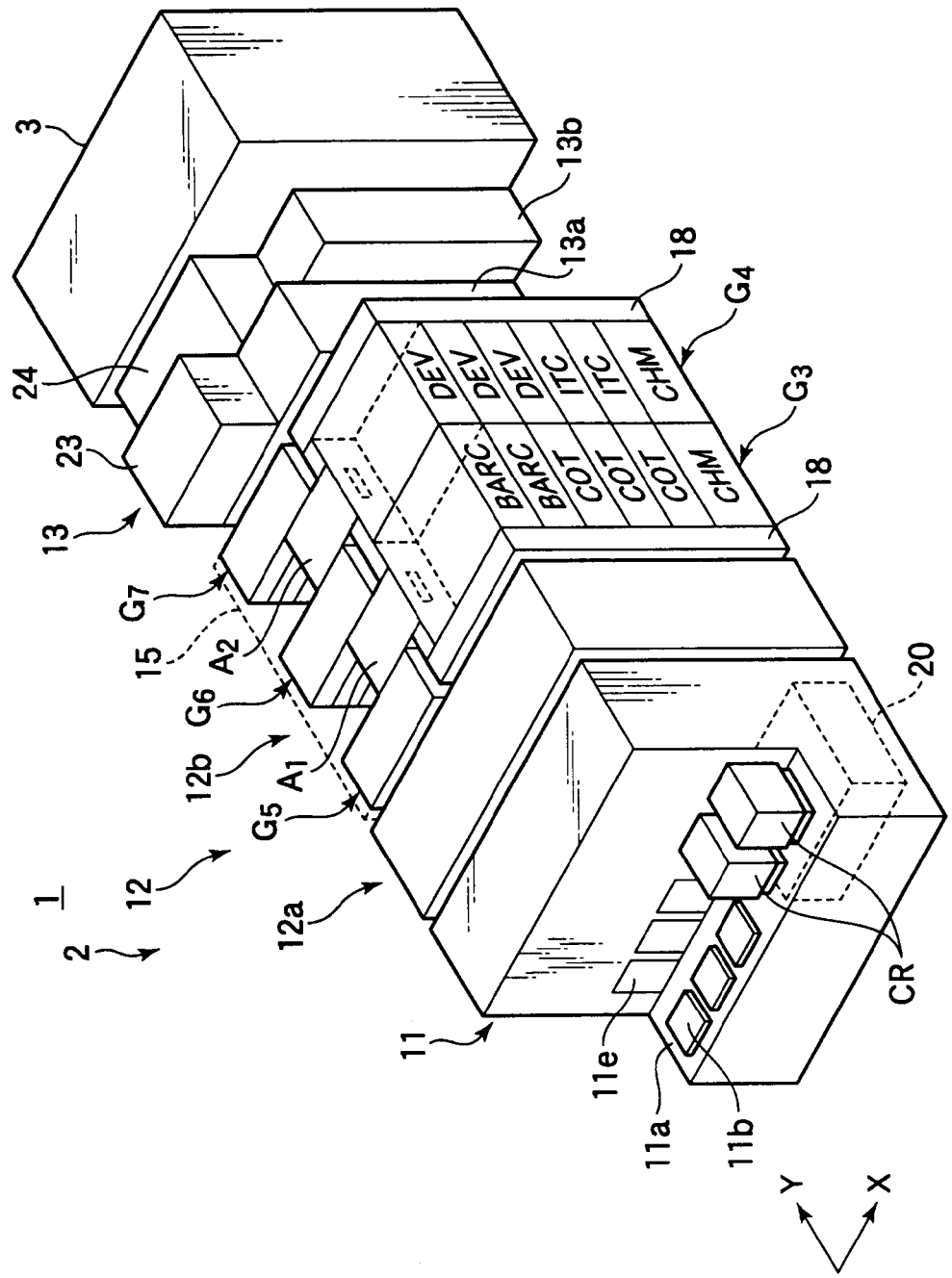
FIG. 2 is a perspective view schematically showing the pattern forming system shown in FIG. 1.

FIG. 1 is a plan view schematically showing a pattern forming system including a coating/developing apparatus according to an embodiment of the present invention. FIG. 2 is a perspective view schematically showing the pattern forming system.

The pattern forming system 1 is designed to form a predetermined resist pattern on a semiconductor substrate or wafer W. The system includes a coating/developing apparatus 2 for performing resist coating or the like on the wafer W and development after light exposure, and a light exposure apparatus 3 for performing an immersion light exposure process on the wafer W. The coating/developing apparatus 2 includes a cassette station 11 used as a transfer station for wafers W, a process station 12 comprising a plurality of processing units each for performing a predetermined process on a wafer W, and an interface station 13 for transferring wafers W between the process station 12 and light exposure apparatus 3. The cassette station 11, process station 12, interface station 13, and light exposure apparatus 3 are arrayed in series in this order in the longitudinal direction of the pattern forming system 1 (Y-direction).

The cassette station 11 includes a cassette table 11a for placing thereon wafer cassettes (CR) each storing a plurality of, such as 13, wafers W, and a wafer transfer mechanism 11c for transferring wafers W between the wafer cassettes (CR) placed on the cassette table 11a and a transit unit located in a third processing unit group $G_3$ in the process station 12, as described later. The cassette table 11a and wafer transfer mechanism 11c are arrayed in series in this order in the Y-direction. The cassette table 11a has a plurality of, such as five, positioning portions 11b each for positioning a wafer cassette (CR), arrayed thereon in the width direction of the pattern forming system 1 (X-direction). A wafer cassette (CR) is placed at each of the positioning portions 20a such that its transfer port faces an opening/closing portion lie formed in a wall of the casing of the wafer transfer mechanism 11c. The wafer transfer mechanism 11c includes a transfer pick 11d disposed in the casing for handling wafers W, so that the wafers W are transferred by the transfer pick 11d between the wafer cassettes (CR) on the cassette table 11a and the process station 12.

As shown in FIG. 2, a control section 20 is located below the cassette station 11 and is used for controlling the coating/developing apparatus 2, as a whole. The control section 20 will be explained in detail later. The light exposure apparatus 3 also includes a control section (not shown).

The process station 12 includes a cleaning/checking section 12a for cleaning and checking a wafer transferred from the cassette station 11, and a coating/developing section 12b for performing processes, such as coating of a resist film, development of the resist film after light exposure, and heating associated with these processes.

Figure 3:
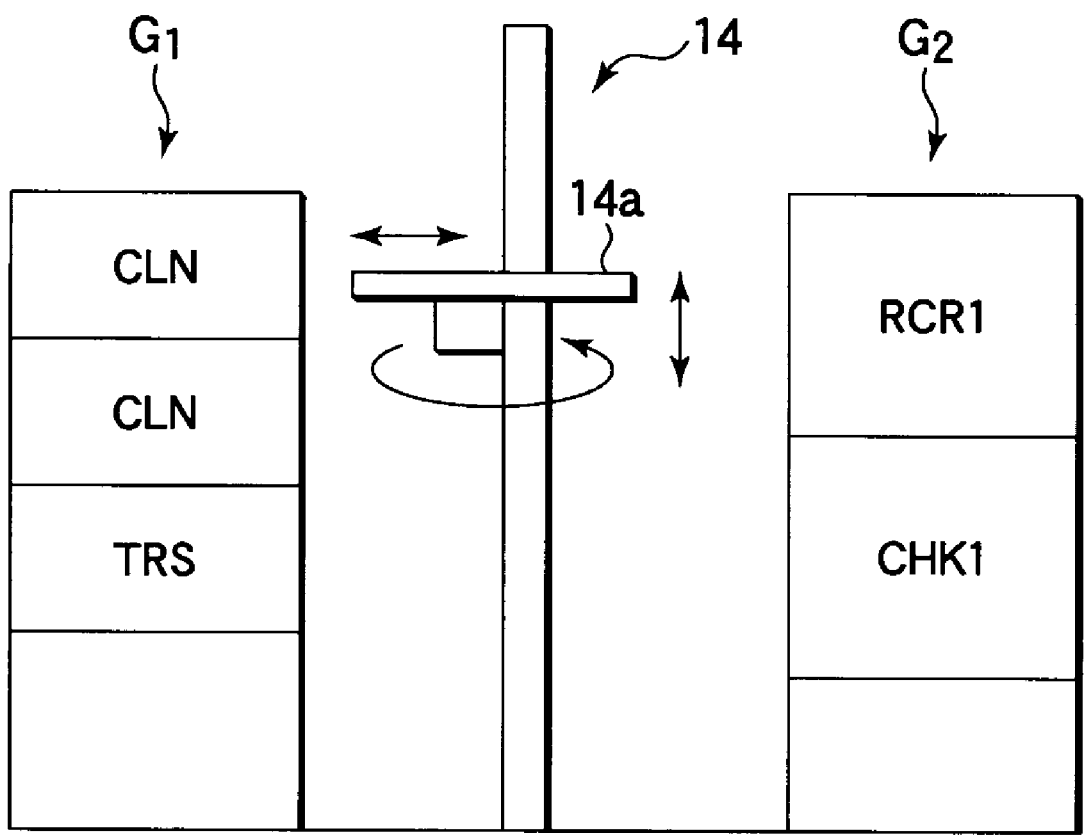
FIG. 3 is a side view schematically showing a cleaning/checking section disposed in the coating/developing apparatus of the pattern forming system shown in FIG. 1.

The cleaning/checking section 12a includes a first processing unit group $G_1$ on the front side, and a second processing unit group $G_2$ on the rear side. A wafer transfer mechanism 14 is disposed between the first and second processing unit groups $G_1$ and $G_2$. As shown in FIG. 3, the first processing unit group $G_1$ includes three units stacked one on the other, which are formed of a transit unit (TRS) and two cleaning units (CLN) for cleaning the back surface and edge portion of a wafer W. The second processing unit group $G_2$ includes two units stacked one on the other, which are formed of a first check unit (CHK1) and a first rejected wafer cassette (RCR1) for storing wafers W rejected by the check. The wafer transfer mechanism 14 includes a fork 14a for transferring wafers W. The fork 14a is movable up and down and rotatable so that it can access the units located in the first processing unit group $G_1$ and second processing unit group $G_2$, and the transit unit (TRS1) of a fifth processing unit group $G_5$ described later.

The coating/developing section 12b is arranged in a casing 15, on the front side of which (lower side in FIG. 1), it includes a third processing unit group $G_3$ and a fourth processing unit group $G_4$ arrayed in this order from the cassette station 11 toward the interface station 13. On the rear side of the casing 15 (upper side in FIG. 1), the coating/developing section 12b includes a fifth processing unit group $G_5$, a sixth processing unit group $G_6$, and a seventh processing unit group $G_7$ arrayed in this order from the cassette station 11 toward the interface station 13. Further, the coating/developing section 12b includes a first main transfer section $A_1$ interposed between the fifth processing unit group $G_5$ and sixth processing unit group $G_6$, and a second main transfer section $A_2$ interposed between the sixth processing unit group $G_6$ and seventh processing unit group $G_7$. Furthermore, the coating/developing section 12b includes an eighth processing unit group $G_8$ behind the first main transfer section $A_1$.

As shown in FIG. 2, the third processing unit group $G_3$ includes a plurality of units stacked one on the other, which are formed of two bottom coating units (BARC) for forming an anti-reflective coating that prevents reflection of light during light exposure on a wafer W, and three resist coating units (COT) for forming a resist film on a wafer W. The fourth processing unit group $G_4$ includes a plurality of units stacked one on the other, which are formed of, e.g., three development units (DEV) for performing a developing process on a wafer W, and two top coating units (ITC) for forming a protection film (top coating film) having water repellency on a resist film formed on a wafer W.

Figure 4:
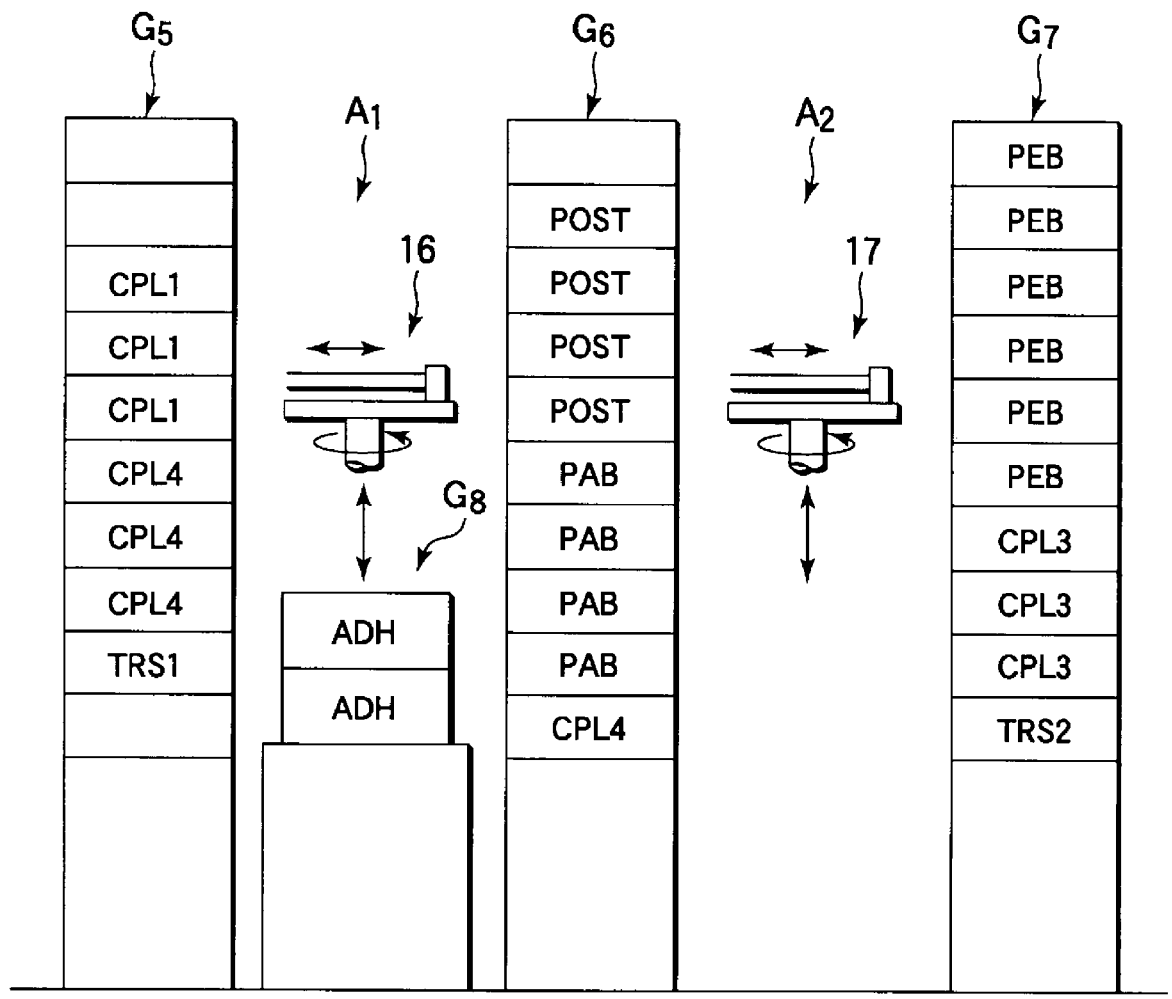
FIG. 4 is a schematic view for explaining mainly the structure of a third processing unit group $G_3$, a fourth processing unit group $G_4$, and a fifth processing unit group $G_5$ disposed in the coating/developing apparatus of the pattern forming system shown in FIG. 1.

The fifth processing unit group $G_5$, sixth processing unit group $G_6$, and seventh processing unit group $G_7$ includes a plurality of, such as ten, units stacked one on the other in each group. These processing units comprises, e.g., a pre-baking unit (PAB) for performing a heating process on a wafer W after resist coating, a post-baking unit (POST) for performing a heating process on a wafer W after development, a post-exposure baking unit (PEB) for performing a heating process on a wafer W after light exposure and before development, a temperature adjusting unit or cooling unit (CPL1) for adjusting, to a predetermined temperature, a wafer W treated by a hydrophobic process or pre-baking, a temperature adjusting unit or cooling unit (CPL3) for adjusting, to a predetermined temperature, a wafer W heated by the post-exposure baking unit (PEB), a cooling unit (CPL4) for cooling a wafer W heated by the post-baking unit (POST), and so forth. The eighth processing unit group $G_8$ includes, e.g., two units stacked one on the other, which are formed of adhesion units for performing a hydrophobic process on a wafer W. These processing units are arranged as shown in FIG. 4, for example. Further, as shown in FIG. 4, the fifth processing unit group $G_5$ includes a transit unit (TRS1) used as a relay position for wafers W between the cassette station 11 and first main transfer section $A_1$. The seventh processing unit group $G_7$ includes a transit unit (TRS2) used as a relay position for wafers W between the second main transfer section $A_2$ and a first wafer transfer mechanism 21 disposed in the interface station 13, as described later.

Each of the pre-baking units (PAB) and post-baking units (POST) includes a heating plate, which is accessible by both of the first main transfer section $A_1$ and second main transfer section $A_2$. On the other hand, each of the post-exposure baking units (PEB) includes a heating plate for heating a wafer W and a cooling plate for cooling a heated wafer, which are accessible by both of the first main transfer section $A_1$ and second main transfer section $A_2$.

The first main transfer section $A_1$ is provided with a first main wafer transfer arm 16 for handling wafers W, which can selectively access the units located in the third processing unit group $G_3$, fifth processing unit group $G_5$, sixth processing unit group $G_6$, and eighth processing unit group $G_8$. The second main transfer section $A_2$ is provided with a second main wafer transfer arm 17 for handling wafers W, which can selectively access the units located in the fourth processing unit group $G_4$, sixth processing unit group $G_6$, and seventh processing unit group $G_7$.

Temperature/humidity adjusting units 18 are respectively disposed between the third processing unit group $G_3$ and cleaning/checking section 12a and between the fourth processing unit group $G_4$ and interface station 13 (see FIG. 1). Each of the temperature/humidity adjusting units 18 includes a temperature adjusting device for process liquids to be supplied to the third and fourth processing unit groups $G_3$ and $G_4$, and a duct for adjustment of temperature and humidity. Chemical units (CHM) are respectively disposed below the third and fourth processing unit groups $G_3$ and $G_4$, for supplying chemical solutions to the third and fourth processing unit groups $G_3$ and $G_4$ (see FIG. 2).

Figure 5:
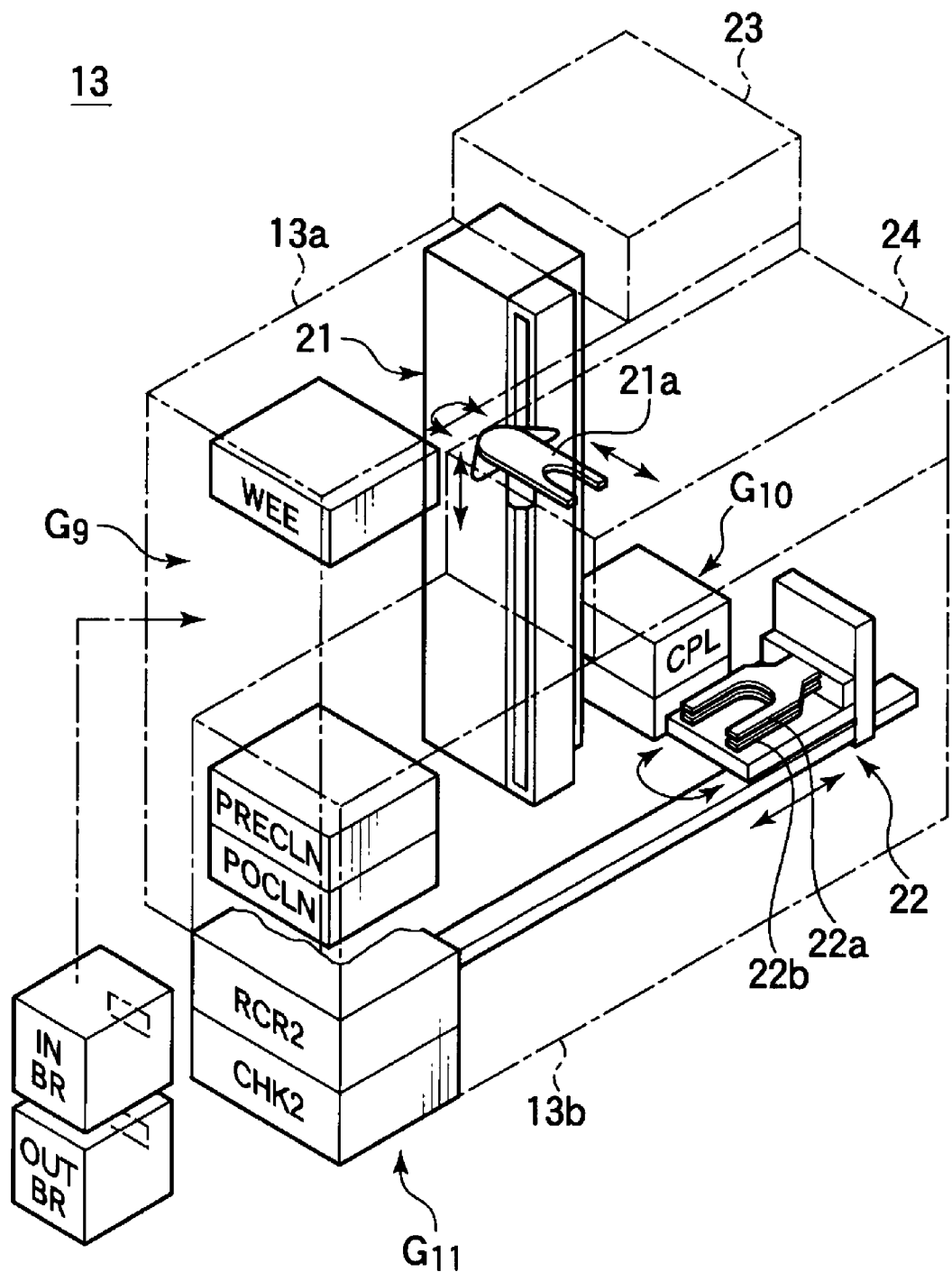
FIG. 5 is a perspective view schematically showing an interface station disposed in the coating/developing apparatus of the pattern forming system shown in FIG.

As shown in the schematic perspective view of FIG. 5, the interface station 13 includes a first interface station 13a on the process station 12 side and a second interface station 13b on the light exposure apparatus 3 side, both disposed in a casing. The first interface station 13a is provided with a first wafer transfer mechanism 21 for transferring wafers W, disposed to face an opening portion of the seventh processing unit group $G_7$. The second interface station 13b is provided with a second wafer transfer mechanism 22 for transferring wafers W.

A ninth processing unit group $G_9$ is located on the front side of the first interface station 13a, and includes several units stacked one on the other, which are formed of a periphery light exposure unit (WEE), an incoming buffer cassette (INBR), an outgoing buffer cassette (OUTBR), a pre-cleaning unit (PRECLN), and a post-cleaning unit (POCLN). The periphery light exposure unit (WEE) is used for performing light exposure selectively only on the edge portion of a wafer W to remove an unnecessary resist portion near the edge of the wafer. The incoming buffer cassette (INBR) is used for temporarily placing wafers W to be transferred to the light exposure apparatus 3. The outgoing buffer cassette (OUTBR) is used for temporarily placing wafers W transferred from the light exposure apparatus 3. The pre-cleaning unit (PRECLN) is used for cleaning a wafer W to be transferred to the light exposure apparatus 3. The post-cleaning unit (POCLN) is used for cleaning a wafer W transferred from the light exposure apparatus 3. An tenth processing unit group $G_{10}$ is located on the rear side of the first interface station 13a, and includes two units stacked one on the other, which are formed of high-precision temperature adjusting units (CPL) for adjusting the temperature of a wafer W with high precision.

On the other hand, an eleventh processing unit group $G_{11}$ is located on the front side of the second interface station 13b, and includes two units stacked one on the other, which are formed of a second check unit (CHK2) for checking the back surface and edge portion of a wafer W with a coating film, such as a resist film, formed thereon, and a second rejected wafer cassette (RCR2) for storing wafers W rejected by the check.

The first wafer transfer mechanism 21 includes a fork 21a for transferring wafers W. The fork 21a is movable up and down and rotatable so that it can selectively access the units located in the seventh processing unit group $G_7$, ninth processing unit group $G_9$, and tenth processing unit group $G_{10}$ to transfer wafers W between these units.

The second wafer transfer mechanism 22 includes two forks 22a and 22b on the upper and lower sides for transferring wafers W. Each of the forks 22a and 22b is horizontally movable in the Y-direction shown in FIG. 1, movable up and down, and rotatable, so that it can selectively access the pre-cleaning unit (PRECLN) and post-cleaning unit (POCLN) of the ninth processing unit group $G_9$, the units located in the tenth processing unit group $G_{10}$ and eleventh processing unit group $G_{11}$, and an incoming stage 3a and an outgoing stage 3b of the light exposure apparatus 3 described later to transfer wafers W between these portions.

A gas flow adjusting section 23 is disposed on top of the first interface station 13a to adjust the gas flow inside the first interface station 13a or interface station 13. A humidifier section 24 is disposed on top of the second interface station 13b to humidify the atmosphere inside the second interface station 13b or interface station 13 not to dry a wafer W transferred from the light exposure apparatus 3.

Figure 6:
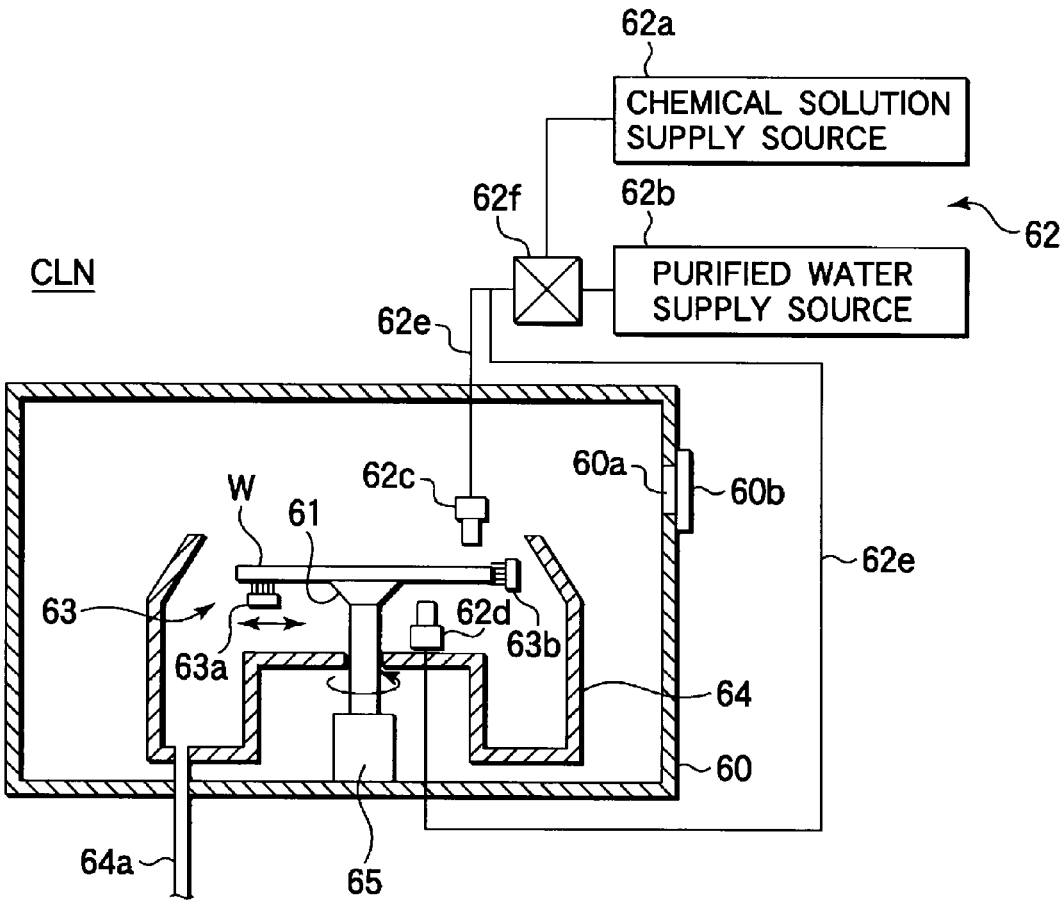
FIG. 6 is a sectional view schematically showing a cleaning unit disposed in the cleaning/checking section of the coating/developing apparatus of the pattern forming system shown in FIG. 1.

As shown in the schematic sectional view of FIG. 6, each of the cleaning units (CLN) of the cleaning/checking section 12a includes a chamber 60 for accommodating a wafer W. A spin chuck 61 is disposed inside the chamber 60 to hold and rotate the wafer W with its front surface facing upward in a horizontal state. A cleaning liquid supply mechanism 62 is disposed to supply a cleaning liquid, such as a chemical solution and purified water, onto the wafer W held by the spin chuck 61. The unit further includes a cleaning mechanism 63.

A cup body 64 is disposed to receive a process liquid, such as a cleaning liquid, thrown off from the wafer W held by the spin chuck 61. A motor 65 is disposed to rotate the spin chuck 61.

The chamber 60 has a transfer port 60a formed in the sidewall for loading/unloading the wafer W therethrough. The transfer port 60a is provided with a shutter 60b. The spin chuck 61 is movable up and down and configured to hold the back surface of the wafer W by a vacuum attraction force while being rotated by the motor 65.

The cleaning liquid supply mechanism 62 includes a chemical solution supply source 62a for supplying a chemical solution as a cleaning liquid, and a purified water supply source 62b for supplying purified water. A front side nozzle 62c is disposed to supply a chemical solution from the chemical solution supply source 62a and purified water from the purified water supply source 62b onto the edge portion of the front surface (upper surface) of the wafer W held by the spin chuck 61. A back side nozzle 62d is disposed to supply a chemical solution from the chemical solution supply source 62a and purified water from the purified water supply source 62b onto the back surface (lower surface) of the wafer W held by the spin chuck 61. A chemical solution from the chemical solution supply source 62a and purified water from the purified water supply source 62b are supplied through conduits 62e into the front side nozzle 62c and back side nozzle 62d. A valve 62f is disposed to switch the chemical solution and purified water and to adjust the flow rates thereof.

The cleaning mechanism 63 includes a wafer back surface cleaning brush 63a and a wafer edge portion cleaning brush 63b. The wafer back surface cleaning brush 63a is movable along the back surface (lower surface) of a wafer W to perform scrub-cleaning on the back surface of the wafer. The wafer edge portion cleaning brush 63b is configured to be stationary at the edge portion during cleaning, while the wafer W is rotated, to perform scrub-cleaning on the edge portion of the wafer W.

The cup body 64 is configured to surround the wafer W held by the spin chuck 61 when the spin chuck 61 with the wafer W held thereon is set at a lower position. The cup body 64 has an upper portion inclined inward and upward to reliably receive a cleaning liquid thrown off from the wafer W and a cleaning liquid supplied from the back side nozzle 62d. A drain line 64a is connected to the bottom of the cup body 64 to discharge a cleaning liquid received by the cup body 64.

The pre-cleaning unit (PRECLN) of the interface station 13 has a structure basically the same as that of each of the cleaning units (CLN) described above. However, where cleaning needs to be performed on the front surface of a wafer W, a front side nozzle 62c is configured to be set at a position above the center of the wafer W. On the other hand, the post-cleaning unit (POCLN) includes no brush, because this unit is not required to perform scrub-cleaning by a brush. Except for this matter, the post-cleaning unit (POCLN) has the same structure as the pre-cleaning unit (PRECLN).

The cleaning units (CLN) and pre-cleaning unit (PRECLN) may employ an ultrasonic cleaning nozzle in place of the brush. In this case, the unit may be arranged such that the ultrasonic cleaning nozzle for the back surface is movable for scanning, and the ultrasonic cleaning nozzle for the front surface is stationary at the edge portion.

Figure 7:
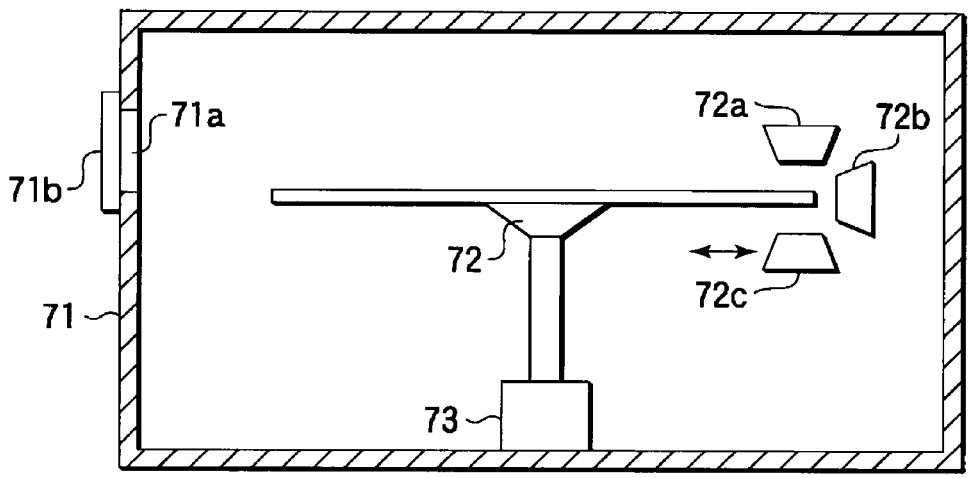
FIG. 7 is a sectional view schematically showing an check unit disposed in the cleaning/checking section of the coating/developing apparatus of the pattern forming system shown in FIG. 1.

As shown in the schematic sectional view of FIG. 7, the first check unit (CHK1) includes a chamber 71, a spin chuck 72 configured to hold and rotate a wafer W inside the chamber 71, and a motor 73 for rotating the spin chuck 72. Three CCD cameras 72a, 72b, and 72c are disposed to pick up images of the front surface edge portion, bevel portion, and back surface of the wafer W held by the spin chuck 72. In order to see the states of the front surface edge portion, bevel portion, and back surface of the wafer W, image processing is performed on images of these portions picked up by the CCD cameras 72a, 72b, and 72c. The CCD camera 72 for the back surface of the wafer W is movable along the back surface of the wafer W to check almost all the back surface of the wafer W. The chamber 71 has a wafer transfer port 71a formed in the sidewall with a shutter 71b for opening/closing it. The check unit (CHK) is used for checking a coating film, e.g., a resist film, in terms of, e.g., film peeling at the edge portion of the wafer W and the coating state thereof. In place of CCD cameras 72a, 72b, and 72c, other optical cameras may be used. Further, they may be provided with an element analysis function to see the deposition state of particles.

The second check unit (CHK2) has the same structure as described above.

The light exposure apparatus 3 includes an incoming stage 3a for placing thereon wafers W transferred from the interface station 13, and an outgoing stage 3b for placing thereon wafers W to be transferred to the interface station 13. The light exposure apparatus 3 further includes an immersion light exposure section 30 structured to perform light exposure on a resist film formed on a wafer W while immersing the resist film in a predetermined liquid. A wafer transfer mechanism 25 is disposed to transfer wafers W between the incoming stage 3a, immersion light exposure section 30, and outgoing stage 3b.

Figure 8:
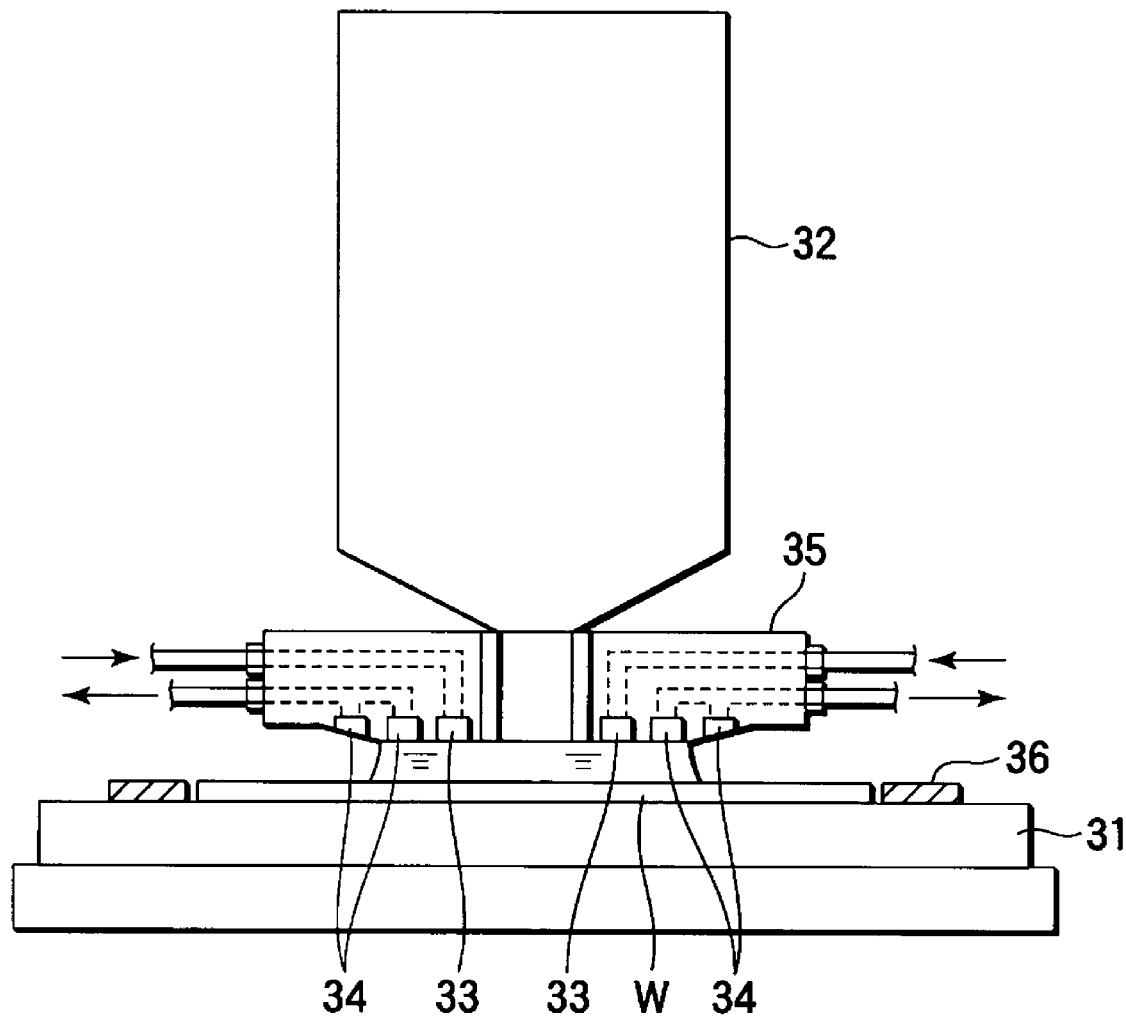
FIG. 8 is a view schematically showing an example of the structure of an immersion light exposure section disposed in a light exposure apparatus in the pattern forming system shown in FIG. 1.

As shown in the schematic sectional view of FIG. 8, the immersion light exposure section 30 includes an openable chamber (not shown) and a stage 31 located in the chamber for placing thereon a wafer W. A projection lens 32 is disposed to project a mask pattern image, obtained by irradiation with light exposure light from a light source (not shown), onto the wafer W placed on the stage 31 to perform light exposure. Supply ports 33 and collection ports 34 for a light exposure liquid, such as purified water, are formed in a light exposure liquid distribution member 35, such that the light exposure liquid is supplied from the supply ports 33 into the gap between the wafer W placed on the stage 31 and the projection lens 32, and is then collected from the collection ports 34.

The stage 31 is movable in a horizontal direction and slightly rotatable. The stage 31 is provided with an annular projection 36 to surround the wafer W placed thereon, so that the wafer W is held by the annular projection 36, and the light exposure liquid supplied on the wafer W is prevented from flowing out. The projection lens 32 magnifies and projects a mask pattern image at a predetermined magnification onto the wafer W for light exposure. As the light exposure light emitted from the light source, far ultraviolet light, such as KrF excimer laser light, or vacuum ultraviolet light, such as ArF excimer laser light, is used. The light exposure liquid distribution member 35 has an annular shape to surround the distal or lower end of the projection lens 32. The supply ports 33 and collection ports 34 are formed at intervals in annular directions on the bottom of the distribution member 35. The light exposure liquid is supplied from the supply ports 33, and is then collected from the collection ports 34 by means of, e.g., suction.

Figure 9:
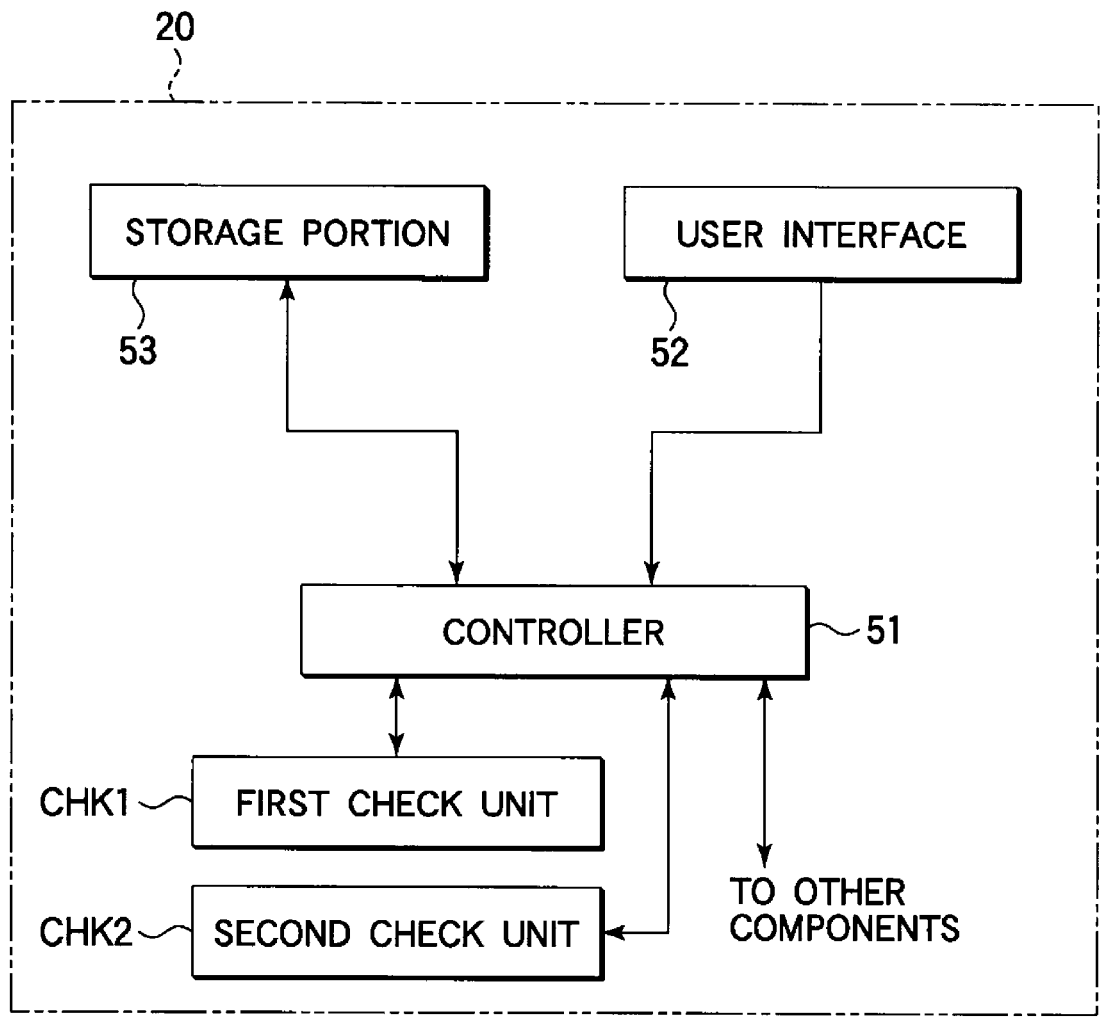
FIG. 9 is a block diagram showing a main part of a control section used in the coating/developing apparatus of the pattern forming system shown in FIG. 1.

As shown in the block diagram of FIG. 9, the control section 20 includes a controller 51 comprising a micro processor (MPU) for controlling the respective components included in the coating/developing apparatus 2, such as the processing units and transfer mechanisms. The controller 51 is connected to the user interface 52, which includes, e.g., a keyboard and a display, wherein the keyboard is used for an operator to input commands for operating the respective components in the pattern forming system 1, and the display is used for showing visualized images of the operational status of the respective components in the pattern forming system 1. Further, the controller 51 is connected to a storage portion 53, which stores data necessary for processes.

The storage portion 53 stores control programs for realizing various processes performed in the coating/developing apparatus 2 under the control of the controller 51, recipes containing process condition data and process sequences recorded therein, databases necessary for processes, and so forth.

When a process is performed, a required recipe is retrieved from the storage portion 53 and executed by the controller 51 in accordance with an instruction or the like input through the user interface 52. Consequently, each of various predetermined processes is performed in the coating/developing apparatus 2 under the control of the controller 51. Recipes are stored in a computer readable medium, such as a CD-ROM, hard disc, flexible disc, or nonvolatile memory. Alternatively, a recipe may be used online while it is transmitted from a suitable apparatus through, e.g., a dedicated line, as needed.

Figure 10:
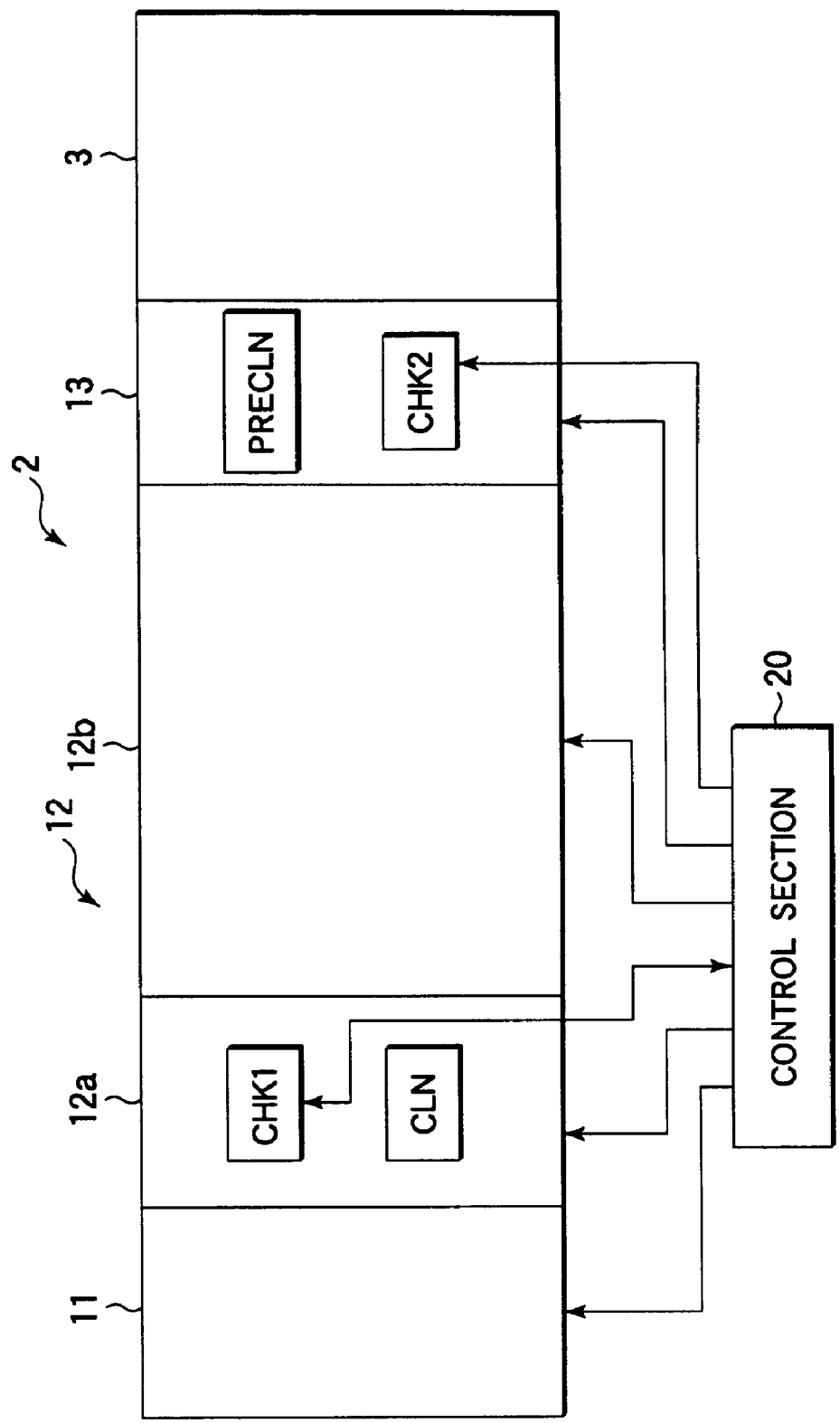
FIG. 10 is a schematic view for explaining the control scheme of the coating/developing apparatus by the control section.

As shown in the schematic view of FIG. 10, the control section 20 is configured not only to control the coating/developing apparatus 2 as a whole, but also to perform the following operation. Specifically, before or after cleaning in each of the cleaning units (CLN), a judgment is made of whether or not the state of the edge portion of a wafer W is within an acceptable range. This judgment is based on a check result of the back surface and edge portion of the wafer W obtained by the first or second check unit (CHK1 or CHK2). Further, in accordance with this judgment, a subsequent process is controlled.

Figure 11:
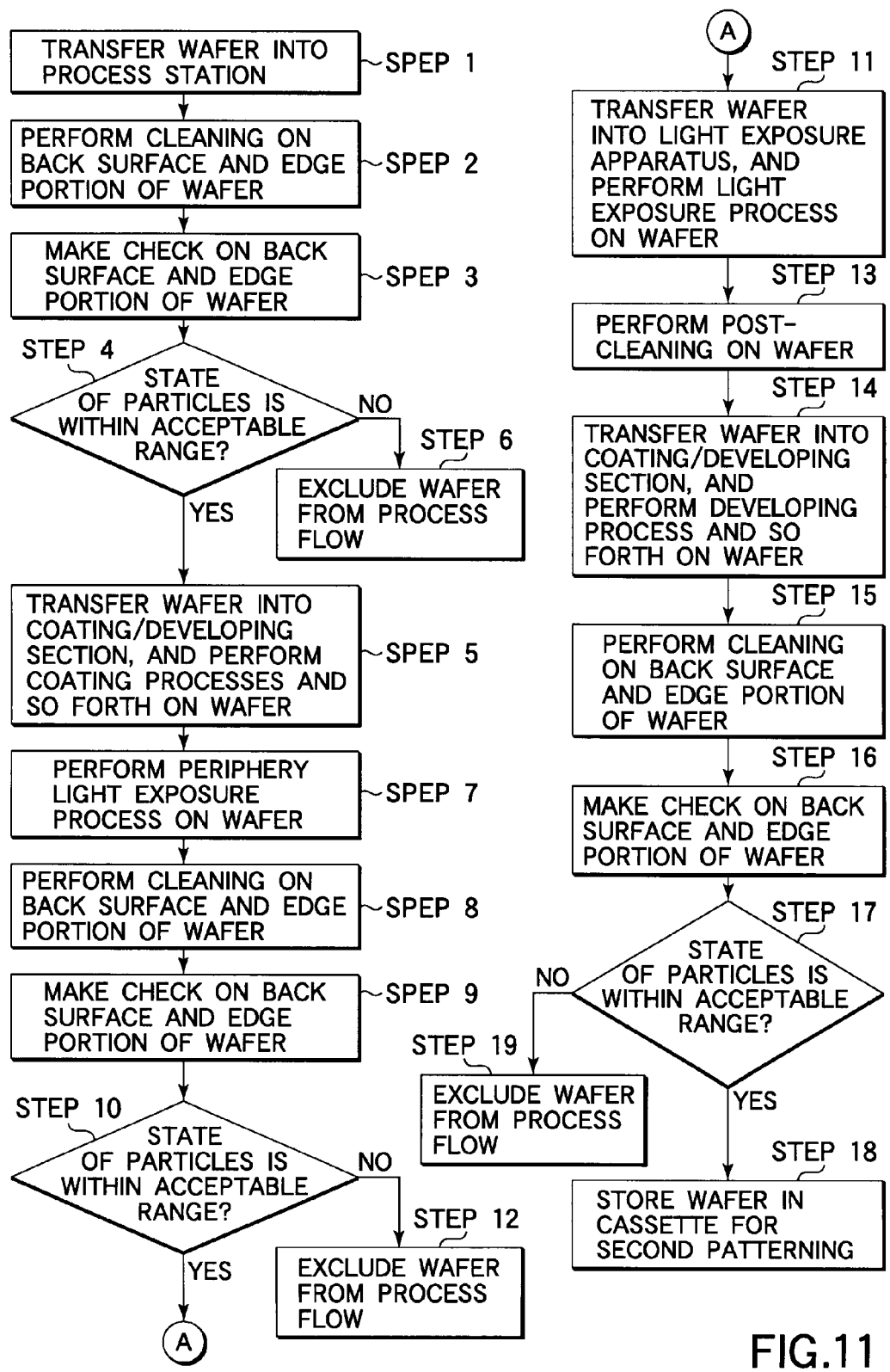
FIG. 11 is a flow chart showing a process flow according to an embodiment in the pattern forming system shown in FIG. 1.

Next, an explanation will be given of a process flow according to an embodiment in the pattern forming system 1 having the structure described above, with reference to the flow chart of FIG. 11.

At first, wafers W are taken out one by one from a wafer cassette (CR) by the transfer pick 11d of the wafer transfer mechanism 11c. A wafer W thus taken out is transferred by the transfer pick 11d into the process station 12 (STEP 1). At this time, the wafer W thus transferred is received by the transit unit (TRS) of the first processing unit group $G_1$.

Then, the wafer W is transferred by the wafer transfer mechanism 14 from the transit unit (TRS) into one of the cleaning units (CLN) of the first processing unit group $G_1$, in which the wafer W is subjected to cleaning on the back surface and edge portion thereof (STEP 2). At this time, the wafer W is held and rotated by the spin chuck 61, and a chemical solution is supplied from the front side nozzle 62c onto the front surface edge portion of the wafer W and from the back side nozzle 62d onto the back surface of the wafer W, to perform scrub-cleaning on the back surface and edge portion of the wafer W by the brushes 63a and 63b. Thereafter, the cleaning liquid is switched to purified water to perform a rinsing process. Then, supply of purified water is stopped and the wafer W is rotated at a high speed to perform a throwing off and drying operation. This cleaning process is performed to remove particles deposited on the back surface of the wafer W during etching and/or film formation precedently performed.

Then, the wafer W thus cleaned is transferred by the wafer transfer mechanism 14 into the first check unit (CHK1) of the second processing unit group $G_2$, in which the wafer W is subjected to a check on the back surface and edge portion thereof (STEP 3). When the check is made on the edge portion and so forth, the wafer W is held and slowly rotated by the spin chuck 72, and images of the front surface edge portion, bevel portion, and back surface of the wafer W are picked up by the three CCD cameras 72a, 72b, and 72c, and are subjected to image processing to see the state of particles. The CCD camera 72c for the back surface is moved for scanning to check the state of particles all over the back surface.

Then, this check result obtained by the first check unit (CHK1) is output to the controller 51 of the control section 20, and a judgment is made of whether or not the state of particles on the back surface and edge portion of the wafer W is within an acceptable range (STEP 4). Where the state of particles on the back surface and edge portion of the wafer W is within the acceptable range, the wafer W is sent to the subsequent steps. Specifically, the wafer W is transferred into the coating/developing section 12b, where the wafer W is subjected to coating processes, such as resist coating, and other processes associated therewith, such as heating processes, (STEP 5). On the other hand, where the state of particles on the back surface and edge portion of the wafer W is out of the acceptable range, the wafer W is transferred into the first rejected wafer cassette (RCR1) of the check unit (CHK), and is thereby excluded from the process flow (STEP 6).

In the coating processes of STEP 5 described above, the wafer W is transferred by the first and second main transfer sections $A_1$ and $A_2$ in the coating/developing section 12b, from the transit unit (TRS1) of the fifth processing unit group $G_5$ sequentially through predetermined units in the third to seventh processing unit group $G_3$ to $G_7$, so that the wafer W is subjected to a series of processes in accordance with the order prescribed in the recipe. For example, the wafer W is sequentially subjected to an adhesion process in one of the adhesion units (ADH), formation of an anti-reflective coating in one of the bottom coating units (BARC), formation of a resist film in one of the resist coating units (COT), formation of a protection film in one of the top coating units (ITC), and a pre-baking process in one of the pre-baking units (PAB).

After the processes of STEP 5 described above is performed, the wafer W is transferred by the first wafer transfer mechanism 21 in the interface station 13, in which the wafer W is subjected to a periphery light exposure process in the periphery light exposure unit (WEE) (STEP 7), and to a pre-light exposure cleaning process in the pre-cleaning unit (PRECLN) (STEP 8).

Since the wafer W thus treated by the coating processes has been cleaned by the cleaning unit (CLN) and confirmed by the first check unit that the state of particles is within the acceptable range before the coating processes, the pre-light exposure cleaning is not necessarily required. However, some new particles may be deposited on the back surface and edge portion of the wafer W in the coating/developing apparatus 2.

Accordingly, in order to clean off the new particles, the pre-light exposure cleaning of STEP 8 is preferably performed. This cleaning process can be performed by scrub-cleaning as in the cleaning process of STEP 2. Further, since this step is used as pre-immersion light exposure cleaning as well, cleaning is preferably also performed on the front surface (upper surface) of the wafer W by the front side nozzle 62a.

Then, the wafer W thus cleaned is transferred by the second wafer transfer mechanism 22 into the second check unit (CHK2) of the eleventh processing unit group $G_{11}$, in which the wafer W is subjected to a check on the back surface and edge portion thereof (STEP 9). This edge portion check is performed in the same manner as in STEP 3 described above.

Then, this check result obtained by the second check unit (CHK2) is output to the controller 51 of the control section 20, and a judgment is made of whether or not the state of particles on the back surface and edge portion of the wafer W is within an acceptable range (STEP 10). Where the state of particles on the back surface and edge portion of the wafer W is within the acceptable range, the wafer W is sent to the subsequent steps. Specifically, the wafer W is transferred into the light exposure apparatus 3, where the wafer W is transferred by the wafer transfer mechanism 25 into the immersion light exposure section 30, in which the wafer W is subjected to an immersion light exposure process (STEP 11). On the other hand, where the state of particles on the back surface and edge portion of the wafer W is out of the acceptable range, the wafer W is transferred into the second rejected wafer cassette (RCR2) of the second check unit (CHK2), and is thereby excluded from the process flow (STEP 12).

Thereafter, the wafer W is transferred by the wafer transfer mechanism 25 onto the outgoing stage 3b. Then, the wafer W is transferred by the second wafer transfer mechanism 22 of the interface station 13 into the post-cleaning unit (POCLN), in which the wafer W is subjected to post-cleaning (STEP 13). Thereafter, the wafer W is transferred by the first and second main transfer sections $A_1$ and $A_2$ in the coating/developing section 12b, from the transit unit (TRS2) of the seventh processing unit group $G_7$ sequentially through predetermined units in the third to seventh processing unit group $G_3$ to $G_7$, so that the wafer W is subjected to a developing process and other processes, such as heating processes before and after the developing process, in accordance with the order prescribed in the recipe (STEP 14). For example, the wafer W is sequentially subjected to a post-exposure baking process in one of the post-exposure baking unit (PEB), a developing process in one of the development units (DEV), and a post-baking process in one of the post-baking units (POST).

Thereafter, the wafer W is transferred through the transit unit (TRS1) of the fifth processing unit group $G_5$ into the cleaning/checking section 12a, where the wafer W is subjected to post-development cleaning on the back surface and edge portion thereof in one of the cleaning units (CLN) (STEP 15) to prepare for the second patterning of a double patterning process. This cleaning is not necessarily required, but, in order to remove particles deposited during the developing process and heating processes before and after the developing process, this cleaning is preferably performed.

After this cleaning, the wafer W is subjected to a check on the back surface and edge portion thereof in the first check unit (CHK1) (STEP 16). This edge portion check is performed in the same manner as in STEP 3 described above.

Then, this check result is output to the controller 51 of the control section 20, and a judgment is made of whether or not the state of particles on the back surface and edge portion of the wafer W is within an acceptable range (STEP 17). Where the state of particles on the back surface and edge portion of the wafer W is within the acceptable range, the wafer W is stored in a cassette for the second patterning (STEP 18). Where the state of particles on the back surface and edge portion of the wafer W is out of the acceptable range, the wafer W is transferred into the first rejected wafer cassette (RCR1) of the first check unit (CHK1), and is thereby excluded from the process flow (STEP 19).

As described above, before a wafer W is transferred into the coating/developing section 12b for performing the coating process (photolithography steps) of a resist film or the like, the wafer W is subjected in line to a cleaning process and then to a check on the state of particles on the back surface and edge portion thereof. Then, only where the state of particles is within an acceptable range, the wafer is transferred into the coating/developing section 12b to perform the coating process. Consequently, wafers contaminated with particles are prevented from being transferred into the coating/developing apparatus 2, thereby decreasing the possibility of defocusing due to particles on the back surface of a wafer W during a light exposure process performed thereafter in the light exposure apparatus 3. Since undesirable wafers W are excluded before the coating process, there is no need to perform unnecessary processes, thereby improving the process efficiency. Since undesirable wafers W are excluded by use of cleaning and checking performed in line, the process can swiftly proceed.

Further, a cleaning process is performed on a wafer before the light exposure, and then the wafer is checked to exclude undesirable wafers. Consequently, wafers to be transferred into the light exposure apparatus have a decreased number of particles on the back surface and edge portion thereof, thereby improving the process reliability.

Further, a cleaning process is performed on a wafer after the developing process, and then the wafer is checked to exclude undesirable wafers. Consequently, wafers to be subjected to the second patterning of a double patterning process have a further decreased number of particles, thereby improving the process reliability.

As regards wafers W excluded from the process flow, in STEPS 6, 12, and 19 described above, they may be left unprocessed. Alternatively, these wafers may be processed again at the end of the lot thereof. Then, where the wafers are found acceptable as a result of a check after a cleaning process, they are sent to the subsequent steps of the process flow. On the other hand, where the wafers are found unacceptable as a result of a check, they are returned to a cassette as rejected wafers.

Next, an explanation will be given of a method according to another embodiment of the present invention, with reference to FIG. 12, which is a flow chart showing a process flow according to this embodiment in the pattern forming system 1.

In the former embodiment, all the wafers W are subjected to a cleaning process and a check, and only wafers acceptable as a result of the check are sent to the subsequent steps. However, there is a case where some wafers are known as requiring no cleaning any more, and the effect of cleaning is essentially reliable. In this case, a cleaning process may be performed only on wafers with an unacceptable state of particles on the back surface and edge portion thereof, which has been found by a check performed in advance. This embodiment relates to such a case.

Figure 12:
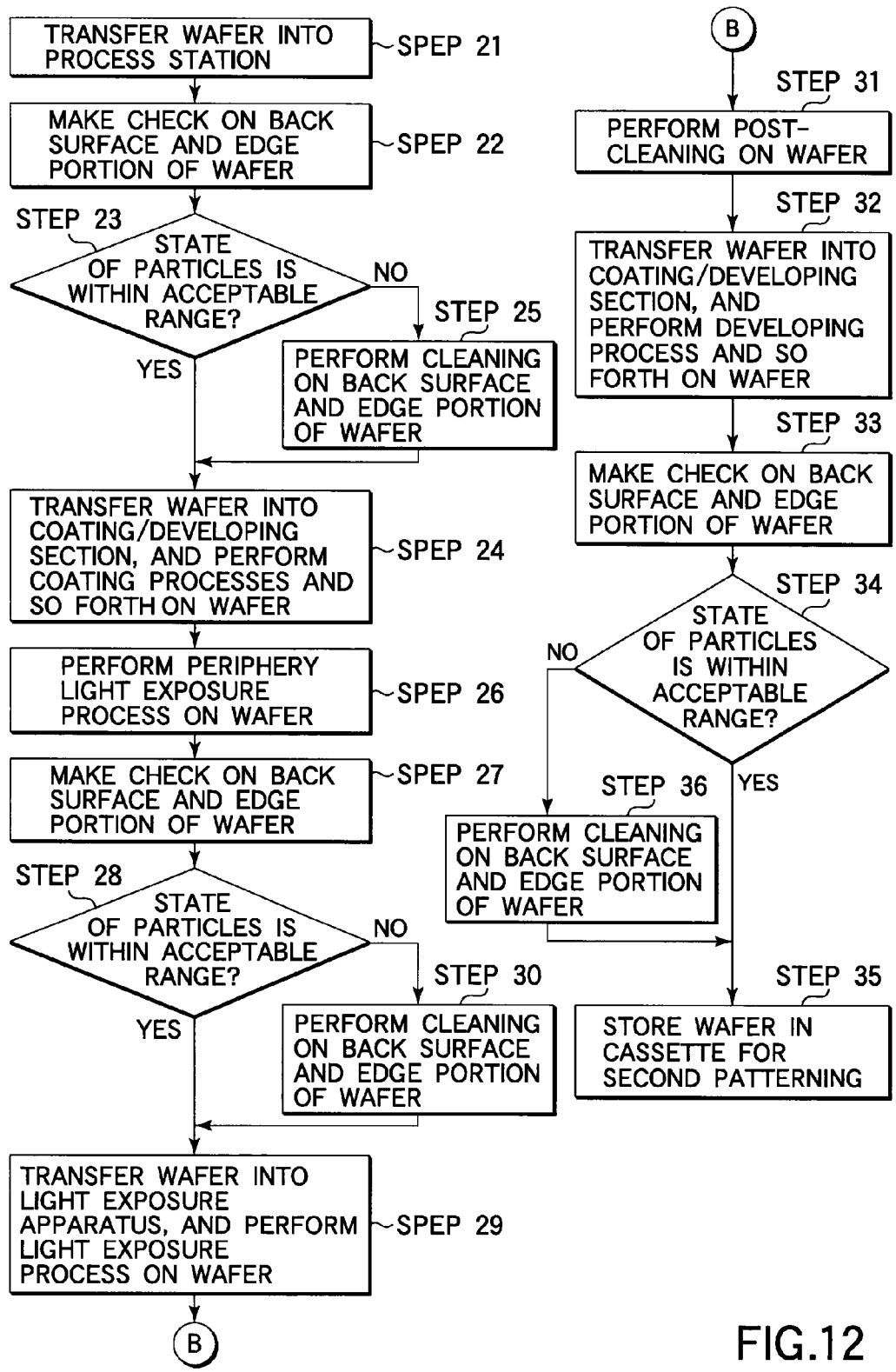
FIG. 12 is a flow chart showing a process flow according to another embodiment in the pattern forming system shown in FIG. 1.

As shown in FIG. 12, at first, wafers W are taken out one by one from a wafer cassette (CR) by the transfer pick 11d of the wafer transfer mechanism 11c. A wafer W thus taken out is transferred by the transfer pick 11d into the process station 12 (STEP 21). At this time, the wafer W thus transferred is received by the transit unit (TRS) of the first processing unit group $G_1$.

Then, the wafer W is transferred by the wafer transfer mechanism 14 from the transit unit (TRS) into the first check unit (CHK1) of the second processing unit group $G_2$, in which the wafer W is subjected to a check on the back surface and edge portion thereof (STEP 22). This check is performed in the same manner as in STEP 3 described above.

Then, this check result obtained by the first check unit (CHK1) is output to the controller 51 of the control section 20, and a judgment is made of whether or not the state of particles on the back surface and edge portion of the wafer W is within an acceptable range (STEP 23). Where the state of particles on the back surface and edge portion of the wafer W is within the acceptable range, the wafer W is sent to the subsequent steps. Specifically, the wafer W is transferred into the coating/developing section 12b, where the wafer W is subjected to coating processes, such as resist coating, and other processes associated therewith, such as heating processes, (STEP 24).

On the other hand, where the state of particles on the back surface and edge portion of the wafer W is out of the acceptable range, the wafer W is transferred into one of the cleaning units (CLN) of the first processing unit group $G_1$, in which the wafer W is subjected to cleaning on the back surface and edge portion thereof (STEP 25). This cleaning is performed in the same manner as in STEP 2 described above.

The wafer W thus cleaned is transferred into the coating/developing section 12b, where the wafer W is subjected to coating processes, such as resist coating, and other processes associated therewith, such as heating processes, in accordance with STEP 24 described above.

After the processes of STEP 24 described above is performed, the wafer W is subjected to a periphery light exposure process (STEP 26), as in the former embodiment. Then, the wafer W is subjected to a check on the back surface and edge portion thereof in the second check unit (CHK2) of the eleventh processing unit group $G_{11}$ (STEP 27). This edge portion check is performed in the same manner as in STEP 3 described above.

Since the wafer W thus treated by the coating processes is a wafer that has been confirmed by the first check unit that the state of particles is within the acceptable range or a wafer that has been cleaned where the state of particles is out of the acceptable range, this check is not necessarily required. However, some new particles may be deposited on the back surface and edge portion of the wafer W in the coating/developing apparatus 2. Accordingly, in order to confirm the state of particles, this check is preferably performed.

Then, this check result obtained by the second check unit (CHK2) is output to the controller 51 of the control section 20, and a judgment is made of whether or not the state of particles on the back surface and edge portion of the wafer W is within an acceptable range (STEP 28). Where the state of particles on the back surface and edge portion of the wafer W is within the acceptable range, the wafer W is sent to the subsequent steps. Specifically, the wafer W is transferred into the light exposure apparatus 3, where the wafer W is transferred by the wafer transfer mechanism 25 into the immersion light exposure section 30, in which the wafer W is subjected to an immersion light exposure process (STEP 29).

On the other hand, where the state of particles on the back surface and edge portion of the wafer W is out of the acceptable range, the wafer W is transferred into the pre-cleaning unit (PRECLN) of the ninth processing unit group $G_9$, in which the wafer W is subjected to cleaning on the back surface and edge portion thereof (STEP 30). This cleaning is performed in the same manner as in STEP 2 described above. The wafer W thus cleaned is transferred into the light exposure apparatus 3, where the wafer W is transferred by the wafer transfer mechanism 25 into the immersion light exposure section 30, in which the wafer W is subjected to an immersion light exposure process, in accordance with STEP 29 described above.

Thereafter, the wafer W is transferred by the wafer transfer mechanism 25 onto the outgoing stage 3b, and then the wafer W is subjected to post-cleaning (STEP 31), as in STEP 13 of the former embodiment. Further, in predetermined units in the third to seventh processing unit group $G_3$ to $G_7$, the wafer W is subjected to a developing process and other processes, such as heating processes before and after the developing process (STEP 32).

Thereafter, the wafer W is transferred through the transit unit (TRS1) of the fifth processing unit group $G_5$ into the cleaning/checking section 12*a*, where the wafer W is subjected to a check on the back surface and edge portion thereof in the first check unit (CHK1) (STEP 33) to prepare for the second patterning of a double patterning process. This check is not necessarily required, but, in order to confirm the state of particles deposited during the developing process and heating processes before and after the developing process, this check is preferably performed.

Then, this check result is output to the controller 51 of the control section 20, and a judgment is made of whether or not the state of particles on the back surface and edge portion of the wafer W is within an acceptable range (STEP 34). Where the state of particles on the back surface and edge portion of the wafer W is within the acceptable range, the wafer W is stored in a cassette for the second patterning (STEP 35). Where the state of particles on the back surface and edge portion of the wafer W is out of the acceptable range, the wafer W is transferred into one of the cleaning units (CLN), in which the wafer W is subjected to post-development cleaning on the back surface and edge portion thereof (STEP 36). Thereafter, the wafer W is stored in a cassette for the second patterning, in accordance with STEP 35 described above.

This embodiment differs from the former embodiment in that, before a coating process, a wafer is first subjected to a check on the state of particles on the back surface and edge portion thereof. Then, the wafer is directly subjected to the coating process where the state of particles is within an acceptable range, or the wafer is subjected to a cleaning process and then to the coating process where the state of particles is out of an acceptable range. Consequently, the number of wafers to be subjected to the cleaning process is decreased, thereby improving the process efficiency.

Since the check is made before the cleaning process, the cleaning process can be performed in accordance with the check result, thereby efficiently performing the cleaning process. Specifically, in this case, the positions of deposited particles may be specified by the check, and then subjected to the cleaning process, which is emphasized on the positions.

Further, a check is made on a wafer before the light exposure, and then the cleaning process is performed on the wafer if particles are present before the wafer is transferred into the light exposure apparatus. Consequently, wafers are processed with high reliability.

Further, a check is made on a wafer after the developing process, and then the cleaning process is performed on the wafer if particles are present. Consequently, wafers to be subjected to the second patterning of a double patterning process have a further decreased number of particles, thereby improving the process reliability.

This embodiment is effective where the necessity of cleaning is not so high or where cleaning is essentially reliable in removing the particles on the back surface and edge portion of a wafer. However, in order to improve the reliability, a recheck may be performed at a suitable timing on wafers, which have been found unacceptable by a check and then subjected to cleaning. In this case, where the state a wafer is out of an acceptable range as a result of the recheck, the wafer may be excluded from the process flow.

According to one of the embodiments described above, before a substrate is transferred into the process section for forming a coating film, such as a resist film, cleaning is performed on at least the back surface and edge portion of the substrate. Then, a check is made on the state of particles on the back surface and edge portion of the substrate, so that, only where the state of particles is within an acceptable range, the substrate is transferred into the process section and subjected to a coating process. Accordingly, substrates contaminated with particles are prevented from being transferred into the process section, thereby decreasing the possibility of defocusing due to particles on the back surface of a substrate during a light exposure process performed thereafter in the light exposure apparatus. Since undesirable substrates are excluded before the coating process, there is no need to perform unnecessary processes, thereby improving the process efficiency. Since undesirable substrates are excluded by use of cleaning and checking performed in line, the process can swiftly proceed.

Further, according to one of the embodiments described above, before a substrate is transferred into the process section for forming a coating film, such as a resist film, a check is made on the back surface and edge portion of the substrate. Then, the substrate is directly subjected to a coating process where the state thereof is within an acceptable range, or the substrate is subjected to a cleaning process and then to a coating process where the state thereof is out of an acceptable range. Consequently, the number of wafers to be subjected to the cleaning process is decreased, thereby improving the process efficiency. Since the check is performed before the cleaning process, the cleaning process can be performed in accordance with the check result, thereby efficiently performing the cleaning process.

Further, before a substrate is transferred into the light exposure apparatus, cleaning and checking of the substrate are also performed to exclude undesirable substrates. Consequently, substrates to be transferred into the light exposure apparatus have a decreased number of particles on the back surface and edge portion thereof, thereby improving the process reliability.

Further, after a substrate is subjected to the developing process, cleaning and checking of the substrate are also performed to exclude undesirable substrates. Consequently, substrates to be subjected to the second patterning of a double patterning process have a further decreased number of particles, thereby improving the process reliability.

The present invention has been described with reference to typical embodiments, but the present invention is not limited to the embodiments described above, and it may be modified in various manners. For example, in the embodiments described above, the present invention is applied to a coating/developing apparatus, but it may be applied to an apparatus for performing only a coating process and processes associated therewith. The embodiments described above employs a check unit configured to check the edge portion by a CCD camera, but the check unit may be configured to use another check member, such as an optical camera. In the embodiments described above, the present invention is applied to a coating/developing apparatus for an immersion light exposure apparatus, but it may be applied to a coating/developing apparatus for an ordinary light exposure apparatus. The embodiments described above are arranged to use a controller to make a judgment of whether or not a check result obtained by a check unit is within an acceptable range, but this judgment may be made by an operator with reference to check images. In the embodiments described above, the cleaning and checking are performed not only before coating but also performed before light exposure and after development. However, the cleaning and checking before light exposure and after development are not essential, and thus they may be omitted at one or both of these timings. Where the cleaning and the checking are performed before light exposure and/or after development in addition to before coating, the operation may be arranged such that the cleaning and the checking are performed in this order as in the first embodiment or the checking and the cleaning are performed in this order as in the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coating film forming apparatus for forming a coating film comprising a resist film or a resist film and an additional film on a substrate, in association with light exposure of the resist film, the coating film forming apparatus comprising:
   a process section including one or more coating units configured to apply the resist film or the resist film and the additional film onto the substrate, and one or more thermally processing units configured to perform a thermal process necessary for forming the coating film on the substrate;
   a pre-coating cleaning unit configured to perform cleaning on at least a back surface and an edge portion of the substrate before transferring the substrate into the process section;
   a pre-coating check unit configured to check a state of a back surface and an edge portion of the substrate before transferring the substrate into the process section;
   an interface section disposed between the process section and a light exposure apparatus;
   a pre-light exposure cleaning unit configured to perform cleaning on at least a back surface and an edge portion of the substrate in the interface section before transferring the substrate into the light exposure apparatus;
   a pre-light exposure check unit configured to check a state of a back surface and an edge portion of the substrate before transferring the substrate into the light exposure apparatus, the pre-light exposure check unit being disposed independently of the pre-coating check unit; and
   a control section equipped with a computer readable non-transitory storage medium storing a control program,
   wherein the control program, when executed, causes the control section to control the coating film forming apparatus:
   to perform a sequence of cleaning the substrate via the pre-coating cleaning unit, checking the substrate via the pre-coating check unit, making a judgment based on a check result thus obtained of whether or not a first state of particles on a back surface and an edge portion of the substrate is within a first acceptable range, and permitting transfer of the substrate into the process section when the first state of particles is within the first acceptable range; and
   then to perform a sequence of cleaning the substrate via the pre-light exposure cleaning unit, checking the substrate via the pre-light exposure check unit, making a judgment based on a check result thus obtained of whether or not a second state of particles on a back surface and an edge portion of the substrate is within a second acceptable range, and permitting transfer of the substrate into the light exposure apparatus when the second state of particles is within the second acceptable range,
   wherein the light exposure apparatus is an immersion light exposure apparatus configured to perform a light exposure process through a liquid, and
   wherein the pre-coating cleaning unit includes a cleaning liquid supply mechanism configured to supply a cleaning liquid onto the substrate, and first and second brushes for cleaning a back surface of the substrate and a side surface of an edge portion of the substrate, respectively, the first brush being movable along the back surface of the substrate to perform scrub-cleaning on the back surface, and the second brush being stationary at the edge portion during cleaning while the substrate is rotated to perform scrub-cleaning on the side surface of the edge portion.

2. The coating film forming apparatus according to claim 1, further comprising:
   a development unit configured to perform a developing process on the substrate after the light exposure, and a thermally processing unit configured to perform a thermal process required before and after the developing process, both of which are disposed in the process section;
   a post-development cleaning unit configured to perform cleaning on at least a back surface and an edge portion of the substrate transferred from the process section after the developing process; and
   a post-development check unit configured to check a state of a back surface and an edge portion of the substrate after the developing process,
   wherein the control section is configured to cause a sequence of cleaning the substrate via the post-development cleaning unit, checking the substrate via the post-development check unit, making a judgment based on a check result thus obtained of whether or not a third state of particles on a back surface and an edge portion of the substrate is within a third acceptable range, and permitting progress of the substrate to a subsequent step when the third state of particles is within the third acceptable range.

3. A coating film forming apparatus for forming a coating film comprising a resist film or a resist film and an additional film on a substrate, in association with light exposure of the resist film, the coating film forming apparatus comprising:
   a process section including one or more coating units configured to apply the resist film or the resist film and the additional film onto the substrate, and one or more thermally processing units configured to perform a thermal process necessary for forming the coating film on the substrate;
   a pre-coating cleaning unit configured to perform cleaning on at least a back surface and an edge portion of the substrate before transferring the substrate into the process section;
   a pre-coating check unit configured to check a state of a back surface and an edge portion of the substrate before transferring the substrate into the process section;
   an interface section disposed between the process section and a light exposure apparatus;
   a pre-light exposure cleaning unit configured to perform cleaning on at least a back surface and an edge portion of the substrate in the interface section before transferring the substrate into the light exposure apparatus;
   a pre-light exposure check unit configured to check a state of a back surface and an edge portion of the substrate before transferring the substrate into the light exposure apparatus, the pre-light exposure check unit being disposed independently of the pre-coating check unit; and
   a control section equipped with a computer readable non-transitory storage medium storing a control program, wherein the control program, when executed, causes the control section to control the coating film forming apparatus:

to perform a sequence of checking the substrate via the pre-coating check unit, making a judgment based on a check result thus obtained of whether or not a first state of particles on a back surface and an edge portion of the substrate is within a first acceptable range, and permitting transfer of the substrate into the process section when the first state of particles is within the first acceptable range, or cleaning the substrate via the pre-coating cleaning unit and then permitting transfer of the substrate into the process section when the first state of particles is out of the first acceptable range; and then to perform a sequence of checking the substrate by the pre-light exposure check unit, making a judgment based on a check result thus obtained of whether or not a second state of particles on a back surface and an edge portion of the substrate is within a second acceptable range, and permitting transfer of the substrate into the light exposure apparatus when the second state of particles is within the second acceptable range, or cleaning the substrate by the pre-light exposure cleaning unit and then permitting transfer of the substrate into the light exposure apparatus when the second state of particles is out of the second acceptable range, wherein the light exposure apparatus is an immersion light exposure apparatus configured to perform a light exposure process through a liquid, wherein the pre-coating cleaning unit includes a cleaning liquid supply mechanism configured to supply a cleaning liquid onto the substrate, and first and second brushes for cleaning a back surface of the substrate and a side surface of an edge portion of the substrate, respectively, the first brush being movable along the back surface of the substrate to perform scrub-cleaning on the back surface, and the second brush being stationary at the edge portion during cleaning while the substrate is rotated to perform scrub-cleaning on the side surface of the edge portion.

4. The coating film forming apparatus according to claim 3, further comprising:

a development unit configured to perform a developing process on the substrate after the light exposure, and a thermally processing unit configured to perform a thermal process required before and after the developing process, both of which are disposed in the process section;

a post-development cleaning unit configured to perform cleaning on at least a back surface and an edge portion of the substrate transferred from the process section after the developing process; and a post-development check unit configured to check a state of a back surface and an edge portion of the substrate after the developing process, wherein the control section is configured to cause a sequence of checking the substrate via the post-development check unit, making a judgment based on a check result thus obtained of whether or not a third state of particles on a back surface and an edge portion of the substrate is within a third acceptable range, and permitting progress of the substrate to a subsequent step when the third state of particles is within the third acceptable range, or cleaning the substrate via the post-development cleaning unit and then permitting progress of the substrate to a subsequent step when the third state of particles is out of the third acceptable range.

5. A coating film forming method for forming a coating film comprising a resist film or a resist film and an additional film on a substrate in a process section, in association with light exposure of the resist film in a light exposure apparatus, the coating film forming method comprising:

performing cleaning on at least a back surface and an edge portion of the substrate via a pre-coating cleaning unit before transferring the substrate into the process section;

checking a state of a back surface and an edge portion of the substrate via a pre-coating check unit before transferring the substrate into the process section after the cleaning;

making a judgment based on a check result thus obtained of whether or not a first state of particles on a back surface and an edge portion of the substrate is within a first acceptable range;

transferring the substrate into the process section when the first state of particles is within the first acceptable range;

applying the resist film or the resist film and the additional film onto the substrate in the process section;

performing a thermal process necessary for forming the coating film on the substrate in the process section;

then performing pre-light exposure cleaning on at least a back surface and an edge portion of the substrate via a pre-light exposure cleaning unit before transferring the substrate into the light exposure apparatus;

checking a state of a back surface and an edge portion of the substrate via a pre-light exposure check unit disposed independently of the pre-coating check unit after the pre-light exposure cleaning and before transferring the substrate into the light exposure apparatus;

making a judgment based on a check result thus obtained of whether or not a second state of particles on a back surface and an edge portion of the substrate is within a second acceptable range; and transferring the substrate into the light exposure apparatus when the second state of particles is within the second acceptable range, wherein the light exposure apparatus is an immersion light exposure apparatus configured to perform a light exposure process through a liquid, and wherein the pre-coating cleaning unit includes a cleaning liquid supply mechanism configured to supply a cleaning liquid onto the substrate, and first and second brushes for cleaning a back surface of the substrate and a side surface of an edge portion of the substrate, respectively, the first brush being movable along the back surface of the substrate to perform scrub-cleaning on the back surface, and the second brush being stationary at the edge portion during cleaning while the substrate is rotated to perform scrub-cleaning on the side surface of the edge portion.

6. The coating film forming method according to claim 5, further comprising:

performing a developing process on the substrate after the light exposure;

performing a thermal process required before and after the developing process;

performing post-development cleaning on at least a back surface and an edge portion of the substrate after the developing process;

checking a state of a back surface and an edge portion of the substrate after the post-development cleaning;

making a judgment based on a check result thus obtained of whether or not a third state of particles on a back surface and an edge portion of the substrate is within a third acceptable range; and sending the substrate to a subsequent step when the third state of particles is within the third acceptable range.

7. A coating film forming method for forming a coating film comprising a resist film or a resist film and an additional film on a substrate in a process section, in association with light exposure of the resist film in a light exposure apparatus, the coating film forming method comprising:

checking a state of a back surface and an edge portion of the substrate via a pre-coating check unit before transferring the substrate into the process section;

making a judgment based on a check result thus obtained of whether or not a first state of particles on a back surface and an edge portion of the substrate is within a first acceptable range;

transferring the substrate into the process section when the first state of particles is within the first acceptable range, or cleaning the substrate via a pre-coating cleaning unit and then transferring the substrate into the process section when the first state of particles is out of the first acceptable range;

applying the resist film or the resist film and the additional film onto the substrate in the process section;

performing a thermal process necessary for forming the coating film on the substrate in the process section;

then checking a state of a back surface and an edge portion of the substrate via a pre-light exposure check unit disposed independently of the pre-coating check unit before transferring the substrate into the light exposure apparatus;

making a judgment based on a check result thus obtained of whether or not a second state of particles on a back surface and an edge portion of the substrate is within a second acceptable range; and transferring the substrate into the light exposure apparatus when the second state of particles is within the second acceptable range, or cleaning the substrate via a pre-light exposure cleaning unit and then transferring the substrate into the light exposure apparatus when the second state of particles is out of the second acceptable range, wherein the light exposure apparatus is an immersion light exposure apparatus configured to perform a light exposure process through a liquid, and wherein the pre-coating cleaning unit includes a cleaning liquid supply mechanism configured to supply a cleaning liquid onto the substrate, and first and second brushes for cleaning a back surface of the substrate and a side surface of an edge portion of the substrate, respectively, the first brush being movable along the back surface of the substrate to perform scrub-cleaning on the back surface, and the second brush being stationary at the edge portion during cleaning while the substrate is rotated to perform scrub-cleaning on the side surface of the edge portion.

8. The coating film forming method according to claim 7, further comprising:

performing a developing process on the substrate after the light exposure;

performing a thermal process required before and after the developing process;

checking a state of a back surface and an edge portion of the substrate after the developing process;

making a judgment based on a check result thus obtained of whether or not a third state of particles on a back surface and an edge portion of the substrate is within a third acceptable range; and sending the substrate to a subsequent step when the third state of particles is within the third acceptable range, or cleaning the substrate and then sending the substrate to a subsequent step when the third state of particles is out of the third acceptable range.

9. A computer readable non-transitory storage medium that stores a control program for execution on a computer to control a coating film forming apparatus, wherein the control program, when executed, causes the computer to control the coating film forming apparatus to perform the coating film forming method according to claim 5.

10. A computer readable non-transitory storage medium that stores a control program for execution on a computer to control a coating film forming apparatus, wherein the control program, when executed, causes the computer to control the coating film forming apparatus to perform the coating film forming method according to claim 7.

11. The coating film forming method according to claim 5, wherein each of the pre-coating check unit and the pre-light exposure check unit includes a mechanism configured to pick up images of a back surface and an edge portion of the substrate, so as to make a judgment of a state of particles on the back surface and the edge portion of the substrate by image processing.

12. The coating film forming method according to claim 7, wherein each of the pre-coating check unit and the pre-light exposure check unit includes a mechanism configured to pick up images of a back surface and an edge portion of the substrate, so as to make a judgment of a state of particles on the back surface and the edge portion of the substrate by image processing.

* * * * *